(12) United States Patent
Strickling et al.

(10) Patent No.: US 11,940,483 B2
(45) Date of Patent: *Mar. 26, 2024

(54) SYSTEMS, METHODS AND DEVICES FOR HIGH-SPEED INPUT/OUTPUT MARGIN TESTING

(71) Applicant: Tektronix, Inc., Beaverton, OR (US)

(72) Inventors: Sam J. Strickling, Portland, OR (US); Daniel S. Froelich, Portland, OR (US); Michelle L Baldwin, Mount Juliet, TN (US); Jonathan San, Palo Alto, CA (US); Lin-Yung Chen, New Taipei (TW)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/470,424

(22) Filed: Sep. 9, 2021

(65) Prior Publication Data

US 2021/0405108 A1 Dec. 30, 2021

Related U.S. Application Data

(63) Continuation-in-part of application No. 16/778,249, filed on Jan. 31, 2020, and a continuation-in-part of application No. 16/778,262, filed on Jan. 31, 2020.
(Continued)

(51) Int. Cl.
*G01R 31/28* (2006.01)
*G01R 31/317* (2006.01)
(Continued)

(52) U.S. Cl.
CPC ..... *G01R 31/2815* (2013.01); *G01R 31/2808* (2013.01); *G01R 31/2818* (2013.01)

(58) Field of Classification Search
CPC ............... G01R 31/31715; G06F 13/20; G06F 13/4068; G06F 13/4282; G06F 30/398;
(Continued)

(56) References Cited

U.S. PATENT DOCUMENTS 5,243,273 A 9/1993 MacAuliffe
6,351,827 B1 2/2002 Co et al.
(Continued)

FOREIGN PATENT DOCUMENTS

JP 2012118002 6/2012
KR 20180006480 1/2018
(Continued)

OTHER PUBLICATIONS

Timothy Lyons et al., "The Implementation and application of a protocol aware architecture" 2013 IEEE International Test Conference (ITC), Sep. 6, 2013, pp. 1-10, IEEE, Anaheim, California.
(Continued)

*Primary Examiner* — Idriss N Alrobaye
*Assistant Examiner* — Henry W Yu
(74) *Attorney, Agent, or Firm* — Seed Intellectual Property Law Group LLP; Andrew J. Harrington; Michael A. Nelson

(57) ABSTRACT

Systems, devices and methods for high-speed I/O margin testing can screen high volumes of pre-production and production parts and identify cases where the electrical characteristics have changed enough to impact operation. The margin tester disclosed is lower cost, easier to use and faster than traditional BERT and scopes and can operate on the full multi-lane I/O links in their standard operating states with full loading and cross-talk. The margin tester assesses the electrical receiver margin of an operation multi-lane high speed I/O link with a device under test simultaneously in either or both directions. In a technology-specific form, an
(Continued)

embodiment of the margin tester can be implemented as an add-in card margin tester to test motherboard slots of a mother board under test, or as a as a motherboard with slots to test add-in cards.

25 Claims, 16 Drawing Sheets

Related U.S. Application Data

(60) Provisional application No. 63/111,533, filed on Nov. 9, 2020, provisional application No. 62/804,942, filed on Feb. 13, 2019, provisional application No. 62/799,720, filed on Jan. 31, 2019.

(51) Int. Cl.
    *G06F 11/273*  (2006.01)
    *G06F 13/20*   (2006.01)
    *G06F 13/40*   (2006.01)
    *G06F 13/42*   (2006.01)
    *G06F 30/398*  (2020.01)
    *H04L 43/50*   (2022.01)

(58) Field of Classification Search
    CPC ......... G06F 2115/12; G06F 2213/0026; G06F 11/273; H04L 43/50
    USPC ................. 716/136; 710/15, 16, 31, 33, 62; 324/763.01
    See application file for complete search history.

(56) References Cited

U.S. PATENT DOCUMENTS

| | | | |
|---|---|---|---|
| 6,449,742 B1* | 9/2002 | Arabi | G01R 31/31926 714/744 |
| 6,765,877 B1 | 7/2004 | Foschiano | |
| 7,099,438 B2* | 8/2006 | Rancu | H04W 24/06 379/9.02 |
| 7,139,949 B1* | 11/2006 | Jennion | G06F 11/2236 714/E11.166 |
| 7,398,514 B2 | 7/2008 | Ulrich | |
| 7,941,718 B2 | 5/2011 | Zhang | |
| 9,042,427 B2 | 5/2015 | Singh | |
| 10,255,151 B1 | 4/2019 | Levin | |
| 2004/0078740 A1 | 4/2004 | Cook | |
| 2004/0133834 A1 | 7/2004 | Kanemitsu | |
| 2004/0176924 A1* | 9/2004 | Salmon | G01R 31/31724 702/125 |
| 2006/0184332 A1 | 8/2006 | Ishida | |
| 2008/0192814 A1* | 8/2008 | Hafed | G01R 31/31901 375/224 |
| 2009/0010171 A1 | 1/2009 | Gupta | |
| 2009/0261807 A1 | 10/2009 | Sawara | |
| 2010/0153052 A1* | 6/2010 | Schmitz | G01R 31/31715 702/117 |
| 2010/0313089 A1 | 12/2010 | Rajski | |
| 2011/0187400 A1 | 8/2011 | Watanabe | |
| 2011/0257953 A1 | 10/2011 | Li | |
| 2012/0245879 A1 | 9/2012 | Mikkola | |
| 2013/0033285 A1 | 2/2013 | McMahon | |
| 2013/0145212 A1 | 6/2013 | Hsu | |
| 2014/0112339 A1 | 4/2014 | Safranek | |
| 2014/0229666 A1 | 8/2014 | Schoenborn | |
| 2015/0067207 A1 | 3/2015 | Iyer | |
| 2016/0087822 A1 | 3/2016 | Kossel | |
| 2016/0266204 A1* | 9/2016 | Chandra | G01R 31/31716 |
| 2017/0019247 A1* | 1/2017 | Iyer | H04L 1/243 |
| 2018/0045781 A1 | 2/2018 | Song | |
| 2018/0091358 A1* | 3/2018 | Sasaki | H04L 43/0817 |
| 2018/0285225 A1 | 4/2018 | Kumar | |
| 2019/0067056 A1 | 2/2019 | Shen | |
| 2020/0025824 A1 | 1/2020 | Zhao | |
| 2020/0249275 A1 | 8/2020 | Froelich | |
| 2020/0250368 A1 | 8/2020 | Froelich | |
| 2021/0406144 A1 | 12/2021 | Strickling | |
| 2022/0091185 A1 | 3/2022 | Strickling | |
| 2022/0317181 A1 | 10/2022 | Sakare | |

FOREIGN PATENT DOCUMENTS

| | | |
|---|---|---|
| TW | I342403 | 5/2011 |
| TW | I440858 | 6/2014 |

OTHER PUBLICATIONS

Salem Abdennadher et al., Practices in High-Speed IO Testing, 2016 21th IEEE European Test Symposium (ETS), May 23, 2016, p. 1-8, IEEE, Amsterdam, Netherlands.

* cited by examiner

Figure 5:
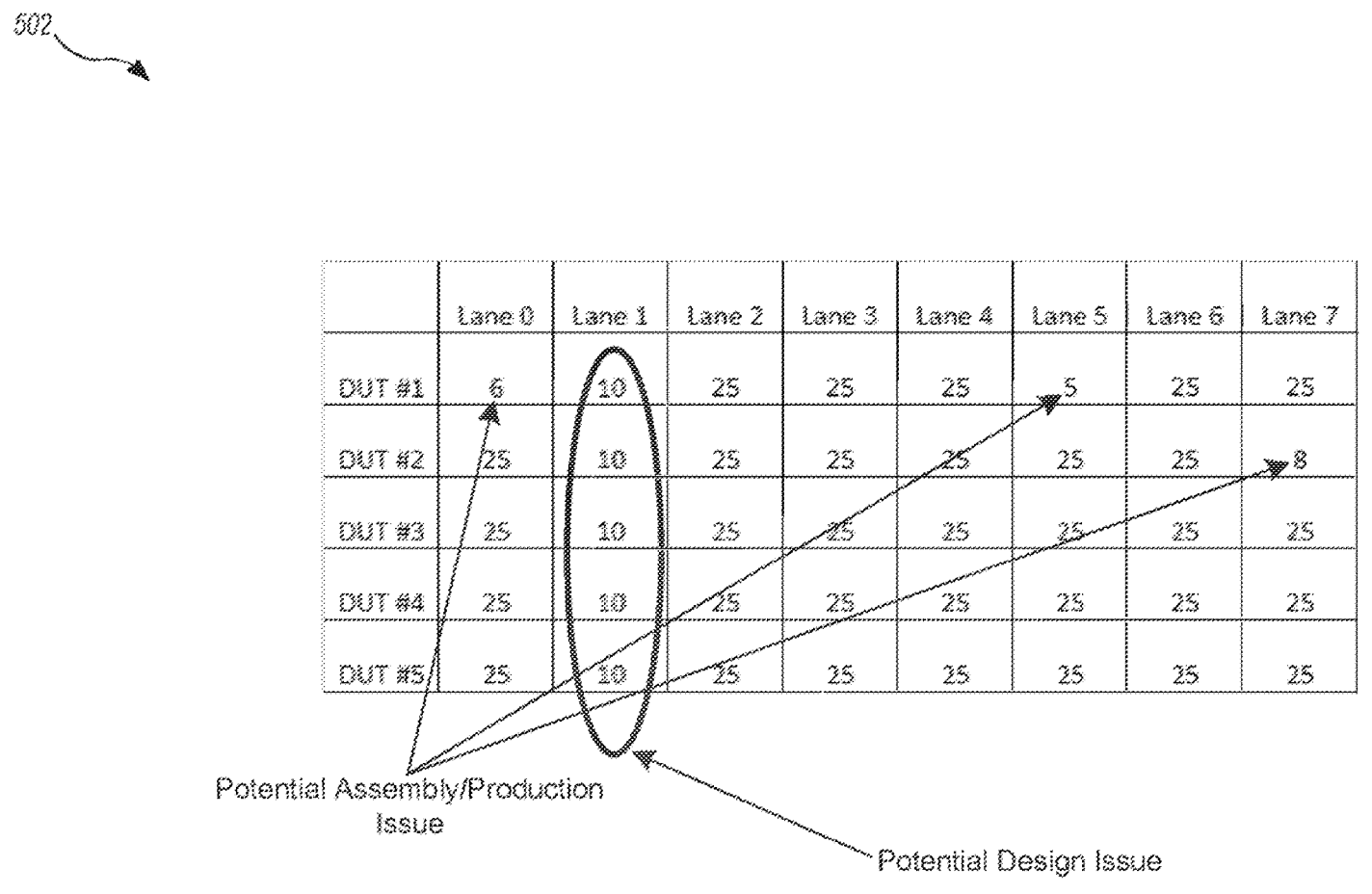

|  | Lane 0 | Lane 1 | Lane 2 | Lane 3 | Lane 4 | Lane 5 | Lane 6 | Lane 7 |
|---|---|---|---|---|---|---|---|---|
| DUT #1 | 6 | 10 | 25 | 25 | 25 | 5 | 25 | 25 |
| DUT #2 | 25 | 10 | 25 | 25 | 25 | 25 | 25 | 8 |
| DUT #3 | 25 | 10 | 25 | 25 | 25 | 25 | 25 | 25 |
| DUT #4 | 25 | 10 | 25 | 25 | 25 | 25 | 25 | 25 |
| DUT #5 | 25 | 10 | 25 | 25 | 25 | 25 | 25 | 25 |

Potential Assembly/Production Issue

Potential Design Issue

SYSTEMS, METHODS AND DEVICES FOR HIGH-SPEED INPUT/OUTPUT MARGIN TESTING

PRIORITY

This disclosure is a continuation-in-part of U.S. patent application Ser. No. 16/778,249, titled "SYSTEMS, METHODS, AND DEVICES FOR HIGH-SPEED INPUT/OUTPUT MARGIN TESTING, filed Jan. 31, 2020, and a continuation-in-part of U.S. patent application Ser. No. 16/778,262, titled "SYSTEMS, METHODS, AND DEVICES FOR HIGH-SPEED INPUT/OUTPUT MARGIN TESTING, filed Jan. 31, 2020, and also claims benefit of U.S. Provisional Application No. 63/111,533, titled "SYSTEMS, METHODS, AND DEVICES FOR HIGH-SPEED INPUT/OUTPUT MARGIN TESTING," filed on Nov. 9, 2020, each of which is incorporated herein by reference in its entirety.

TECHNICAL FIELD

This disclosure relates to test and measurement systems, and more particularly to systems and methods for performing high-speed electrical margin tests on an electrical device-under-test (DUT).

BRIEF DESCRIPTION OF THE SEVERAL VIEWS OF THE DRAWINGS

The components in the drawings are not necessarily to scale relative to each other. Like reference numerals designate corresponding parts throughout the several views.

FIG. 5 is a chart showing results of another example margin test of a device under test (DUT) performed by a high-speed I/O margin tester and identification of potential DUT assembly or production issues based on the results of the margin test, according to an example embodiment.

DETAILED DESCRIPTION

Figure 1:
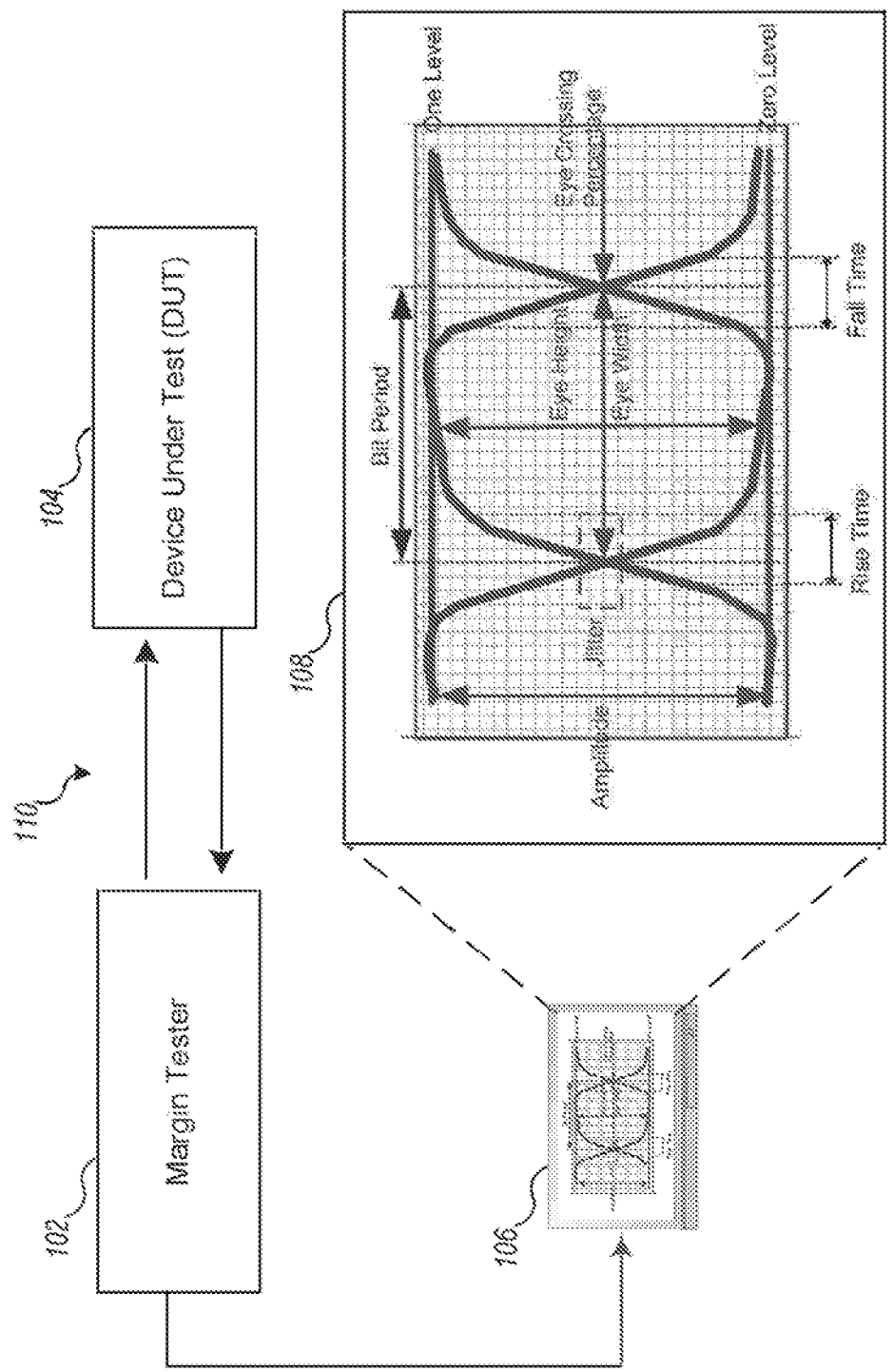
FIG. 1 is an overview block diagram illustrating an example environment in which embodiments of systems, devices and methods for high-speed input/output (I/O) margin testing may be implemented, according to an example embodiment.

Designers and manufacturers of electrical devices require test and measurement instruments and appropriate test procedures to ensure that the devices function properly. Such testing may be done during an engineering characterization stage of designing a new device in order to, for example, compare actual electrical performance of the device to simulated performance to ensure that the device is performing as designed. Such testing may also be done in a production manufacturing environment after an engineering design is finalized in order to find any manufacturing defects in each device produced.

Many electrical devices are designed to include high-speed I/O signal paths or busses. For example, modern personal computer (PC) motherboards, as well as other types of electrical devices, often include high-speed serial PCI Express (also abbreviated as PCIe, or PCI-e) busses, which are busses that are compliant with and perform according to the PCI Express high-speed serial computer expansion bus standard. Format specifications for the PCI Express standard are maintained and developed by the PCI Special Interest Group (PCI-SIG). These busses are typically used for communication between the motherboard and add-in/daughter cards that plug into PCIe connector slots or ports on the motherboard. Many other electrical devices besides motherboards also employ PCIe busses and connectors for high-speed I/O. PCIe Generation 4 (Gen 4 or version 4) devices can achieve bandwidths up to 16 gigatransfers per second (GT/s). PCIe Generation 5 (Gen 5 or version 5) devices can achieve bandwidths up to 32 GT/s.

PCIe devices communicate via a logical connection called an interconnect or link. A link is a point-to-point communication channel between two PCIe ports allowing simultaneous bi-directional traffic. At the physical level, a link is composed of one or more lanes. Low-speed PCIe devices use a single-lane (x1) link, while a high-speed PCIe device, such as a graphics adapter, typically uses a much wider and faster 16-lane (x16) link. A lane is composed of two differential signaling pairs, with one pair for receiving data and the other for transmitting. Thus, each lane is composed of four wires or signal traces. Conventionally, performance of the lanes of a PCIe device is tested using a Bit Error Rate Tester (BERT) and/or a high-speed signal generator and oscilloscope (scope).

At an engineering bench test and/or engineering characterization stage of development of a printed circuit board (PCB), board design high speed routes (e.g. PCIe interconnects) are simulated, or design "recipes" or reference designs are followed. Pre-production board samples are then often built and tested. However, testing each board sample and each lane for all high speed I/Os with Bit Error Rate Test instruments (BERTs) and scopes is typically not feasible due to cost, time, and complexity constraints. In particular, traditional BERTs and scopes for testing high speed I/O standards such as PCIe continue to increase in cost and complexity as data rates increase. A single Tx and Rx test station for testing a single PCIe lane at a time can cost over one million dollars. The instruments are also difficult to use for traditional Tx and Rx tests and calibrations and expert (often PhD level) users and significant amounts of time are required to ensure measurements are taken correctly and instruments remain in good working order. As a result of these constraints, traditional BERTs and scopes are used infrequently in volume electrical testing of pre-production silicon, boards, PCBs and cables, and are usually not used at all in production testing.

However, as data rates of I/O links like PCI Express 5.0 at 32.0 GT/s increase, the risk of even small or subtle issues significantly impacting the performance of these I/O links increases, and the importance of doing some testing to flag electrical performance issues on every pre-production sample, port and lane to prevent issues before production and to test electrical performance on every unit on production lines to catch production related issues (bad parts, etc.) before they lead to customers' issues and returns increases. Furthermore, traditional BERTs and scopes only allow testing on a single lane at a time, so the testing occurs in an environment different from the real operation of these I/O links, which usually form multi-lane links and can suffer significant cross-talk and loading issues during real operation, which can be missed by traditional BERT and scope testing even when that testing does/can occur. Likewise, in a manufacturing test environment, when assembling and testing multiple PCBs of a given design, production lines also do not typically use BERTs and scopes for high speed I/O tests due to cost, time, and complexity constraints.

Thus, there is a growing need for a new type of instrument that can screen high volumes of pre-production and production parts and identify cases where the electrical characteristics have changed enough to impact operation. This instrument has the most value if it is low cost, very easy to use and very fast compared to traditional BERT and scopes and can operate on the full multi-lane I/O links in their standard operating states with full loading and cross-talk. Overall, knowing the electrical margin (statistically valid operating margins) for each high speed I/O lane in each direction has value in increasing the likelihood of finding both design (e.g., per lane across all production samples) and assembly (e.g., specific board/lane instances) issues across all production samples.

Some conventional solutions rely only on functional tests as the best approximation (e.g., simply plugging in a "golden" or reference device and testing the link will come up at full speed). Other companies use on-die electrical margining in the silicon for their board, but that gives them only information in one direction and is not calibrated/characterized like a test instrument and leaves significant work to deal with and understand unit to unit variation in the add-in card they have selected for the purpose.

Disclosed herein are systems, devices and methods for high-speed input/output (I/O) margin testing that solve the technical problems above.

FIG. 1 is an overview block diagram illustrating an example environment in which embodiments of systems, devices and methods for high-speed I/O margin testing may be implemented, according to an example embodiment. In one embodiment, shown is a margin tester 102 that assesses the electrical receiver margin of an operation multi-lane high speed I/O link 110 of an example DUT 104 in either or both Tx and Rx directions. The margin tester 102 of FIG. 1 represents one or more of the embodiments of the margin tester disclosed herein.

The margin tester 102 may be coupled to a test station, PC, terminal or other display device 106 that may process, replicate and/or present an eye pattern display or data eye diagram 108 representing various aspects of the multi-lane high speed I/O link 110. In some embodiments, the test station, PC, terminal or other display device 106 may be integrated with or as part of the margin tester 102. The eye pattern display or data eye diagram 108 is a representation of a high speed digital signal that allows key parameters of the electrical quality of a signal to be quickly visualized and determined, and thus data therefrom may be used to determine statistically valid operating margins of a DUT. The eye pattern display or data eye diagram 108 is constructed from a digital waveform by folding the parts of the waveform corresponding to each individual bit into a single graph with signal amplitude on the vertical axis and time on horizontal axis. By repeating this construction over many samples of the waveform, the resultant graph will represent the average statistics of the signal and will resemble an eye. The eye opening corresponds to one bit period and is typically called the Unit Interval (UI) width of the eye pattern display or data eye diagram 108. The bit period is a measure of the horizontal opening of an eye diagram at the crossing points of the eye and is usually measured in picoseconds for a high speed digital signal (i.e., 200 ps is used for a 5 Gbps signal). The data rate is the inverse of bit period (1/*bit* period). The bit period is commonly called the Unit Interval (UI) when describing an eye diagram. The advantage of using UI instead of actual time on the horizontal axis is that it is normalized and eye diagrams with different data rates can be easily compared. Eye width is a measure of the horizontal opening of an eye diagram. It is calculated by measuring the difference between the statistical mean of the crossing points of the eye. Rise time is a measure of the mean transition time of the data on the upward slope of an eye diagram. The measurement is typically made at the 20 and 80 percent or 10 and 90% levels of the slope. Fall time is a measure of the mean transition time of the data on the downward slope of an eye diagram. The measurement is typically made at the 20 and 80 percent or 10 and 90 percent levels of the slope. Jitter is the time deviation from the ideal timing of a data-bit event and an important characteristic of a high speed digital data signal. To compute jitter, the time deviations of the transitions of the rising and falling edges of an eye diagram at the crossing point are measured. Fluctuations can be random and/or deterministic. The time histogram of the deviations may be analyzed to determine the amount of jitter. The peak-to-peak (p-p) jitter is defined as the full width of the histogram, meaning all data points present. Root mean square (RMS) jitter is defined as the standard deviation of the histogram. The units for a jitter measurement on a high speed digital signal are normally in picoseconds.

Embodiments of the margin tester 102 can take at least two forms: technology-specific and general purpose. The margin tester 102 can be used with any high speed I/O protocol link of any link width (number of lanes) and use any form of high speed differential signaling including, but not limited to, non-return to zero (NRZ), pulse amplitude modulation-3 (PAM-3), and pulse amplitude modulation-4 (PAM-4). For the sake of a specific example embodiment for testing, PCI Express will be used. However, different high-speed serial bus standards, hardware and protocols may be used.

Figure 2:
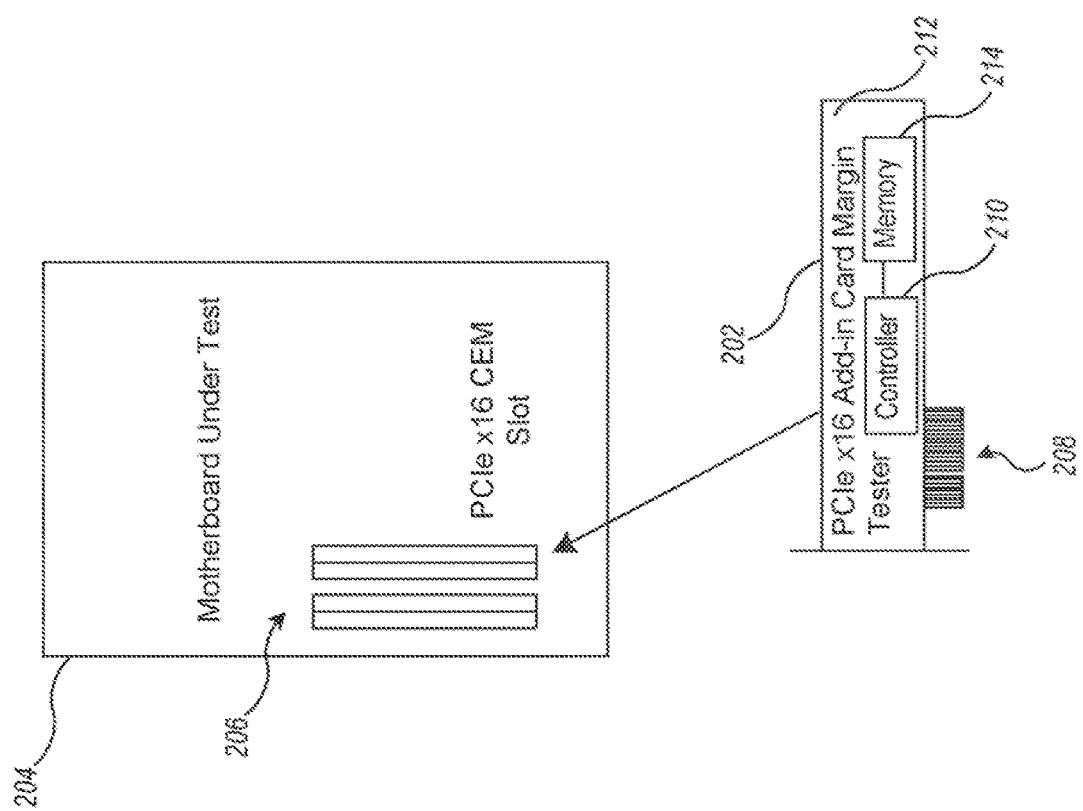
FIG. 2 is a block diagram illustrating an example technology-specific add-in card margin tester compliant with the Peripheral Component Interconnect (PCI) Express high-speed serial computer expansion bus standard to margin test PCI Express motherboard slots, according to an example embodiment.

FIG. 2 is a block diagram illustrating an example technology-specific add-in card margin tester 202 compliant with the PCI Express high-speed serial computer expansion bus standard to margin test PCI Express motherboard slots 206, according to an example embodiment.

In a technology-specific form, an embodiment of the margin tester can be implemented as a PCI Express add-in card margin tester 202 to test PCI Express motherboard slots 206 of a mother board under test 204. For example, the PCI Express add-in card margin tester 202 may be a PCI Express x16 card electromechanical specification (CEM) form factor add-in card. In another embodiment of the technology-specific form, an embodiment of the margin tester can be implemented as a motherboard with PCI Express slot(s) to test PCI Express add-in cards (which is shown in FIG. 3).

The PCI Express add-in card margin tester 202 may be in the form factor of a standard PCI Express compliant add-in card for a specific PCI Express form factor (for example, CEM or M.2 (formerly known as the Next Generation Form Factor (NGFF) or U.2 (formerly known as SFF-8639), etc.). The PCI Express add-in card margin tester 202 may comprise one or more printed circuit boards (PCBs), such as PCB 212 and one or more components that implement compliant PCI Express physical and logical link layers for each lane. The PCI Express add-in card margin tester 202 may comprise a plurality of interfaces (such as connectors 208) coupled to the PCB 212 and a controller 210. As will be understood by one skilled in the art, a controller 210 is not limited to a single controller but may include one or more controllers working in conjunction. Such interfaces may comprise a plurality of connectors 208 that connect to the motherboard slots 206 and margin tester transmitters, which, under control of the controller 210, optionally include the ability to inject controlled noise, for example, through voltage swing and sinusoidal jitter, such that the eye margin expected at the receiver of motherboard under test 204 can be varied to specific targets for timing or voltage margin without the need for software running on the motherboard under test 204. The controller 210 may also be coupled to memory 214, which may store instructions and other data the controller 210 may read, use and/or execute to perform the functions described herein.

Various embodiments of the margin tester 102 (including the technology-specific PCI Express add-in card margin tester 202, the technology-specific motherboard margin tester 302 and the general purpose margin tester 602) may be with or without the noise injection. For cost-conscious production tests, the embodiment without noise injection may be more appealing. The margin tester receivers in the compliant physical layer implementation may include the ability to margin the link as defined in the PCI Express 4.0/5.0 lane margining specifications, but may also include additional and more sophisticated on-die margining capabilities. In one embodiment, the margin tester receivers may measure eye margin by moving the independent error detector and comparing for mismatches with the data sampler. In one implementation, the controller 210, which causes the margin tester 102 (including technology-specific PCI Express add-in card margin tester 202, technology-specific motherboard margin tester 302 and the general purpose margin tester 602) to perform the functions described herein, may be implemented with a field programmable gate array (FPGA) and the FPGA I/Os, which is shown in further detail in FIG. 7 through FIG. 9. However, other combinations of configurable controller hardware, firmware and/or software may be used.

Figure 3:
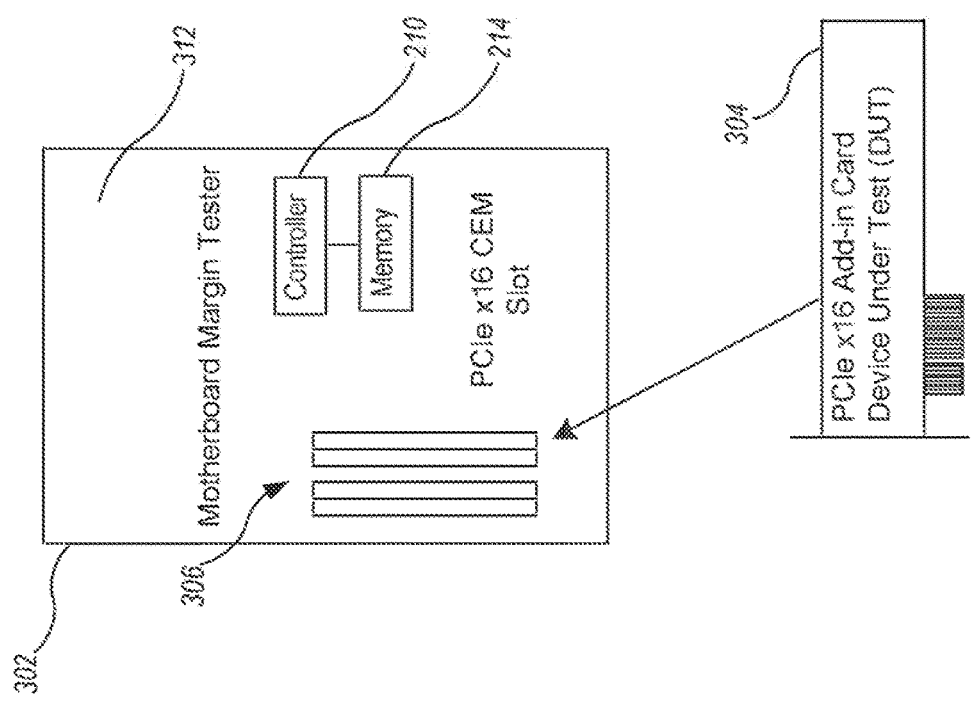
FIG. 3 is a block diagram illustrating a motherboard with slots compliant with the PCI Express high-speed serial computer expansion bus standard to margin test PCI Express add-in cards, according to an example embodiment.

FIG. 3 is a block diagram illustrating an example technology-specific motherboard margin tester 302 with slots compliant with the PCI Express high-speed serial computer expansion bus standard to margin test PCI Express add-in cards, according to an example embodiment.

The motherboard margin tester 302 is another example of a technology-specific embodiment of the margin tester 102 disclosed herein, implemented as a motherboard margin tester 302 with one or more PCI Express slots 306 to test PCI Express add-in cards, such as the PCIe x16 add-in card DUT 304 shown in FIG. 3. The motherboard margin tester 302 may comprise a plurality of interfaces (e.g., one or more PCI Express slots 306) coupled to the PCB 312 and the controller 210. For example, such interfaces may comprise a plurality of one or more PCI Express slots 306 into which the PCIe x16 add-in card DUT 304 may be inserted for testing. Margin tester transmitters, which, under control of the controller 210, optionally include the ability to inject controlled noise, for example, through voltage swing and sinusoidal jitter (described further below and with respect to FIG. 8 and FIG. 9), such that the eye margin expected at the receiver of PCIe x16 add-in card DUT 304 can be varied to specific targets for timing or voltage margin without the need for software running on the PCIe x16 Add-in card DUT 304. For example, the controller 210 may be configured to assess the electrical margin of the single-lane or multi-lane high speed I/O link by at least being configured to inject reduction of eye width opening by injecting jitter on margin test transmitters (or implementing other eye width opening reduction methods), the injection of jitter being selectable to be applied on all lanes of the single-lane or multi-lane high speed I/O link simultaneously or applied independently per lane of the of the single-lane or multi-lane high speed I/O link. Also, the controller 210 may be configured to assess the electrical margin of the single-lane or multi-lane high speed I/O link by at least being configured to inject reduction of eye height opening by injecting noise on margin test transmitters (or implementing other eye height opening reduction methods), the injection of noise being selectable to be applied on all lanes of the single-lane or multi-lane high speed I/O link simultaneously or applied independently per lane of the of the single-lane or multi-lane high speed I/O link. The controller 210 may also be configured to assess the electrical margin of the single-lane or multi-lane high speed I/O link by at least being configured to introduce varying amounts of skew lane-to-lane across multiple lanes.

The controller 210 may also be coupled to memory 214, which may store instructions and other data the controller 210 may read, use and/or execute to perform the functions described herein.

Durability and insertion count are significant issues for the technology-specific embodiments of the margin tester 102 (including technology-specific PCI Express add-in card margin tester 202 and technology-specific motherboard margin tester 302). Thus, the PCB 212 and PCB 312 may be implemented and the margins characterized using an adaptor which is configured to be replaced at low cost when it wears out without replacing the rest of the margin test unit. For example, a replaceable adapter may be coupled to the one or more PCI Express slots 306 and/or connectors 208 and be configured to wear out after a particular amount of use. The adaptor may then be replaced once it wears without replacing the rest of the PCI Express add-in card margin tester 202 or motherboard margin tester 302, as applicable.

Figure 4:
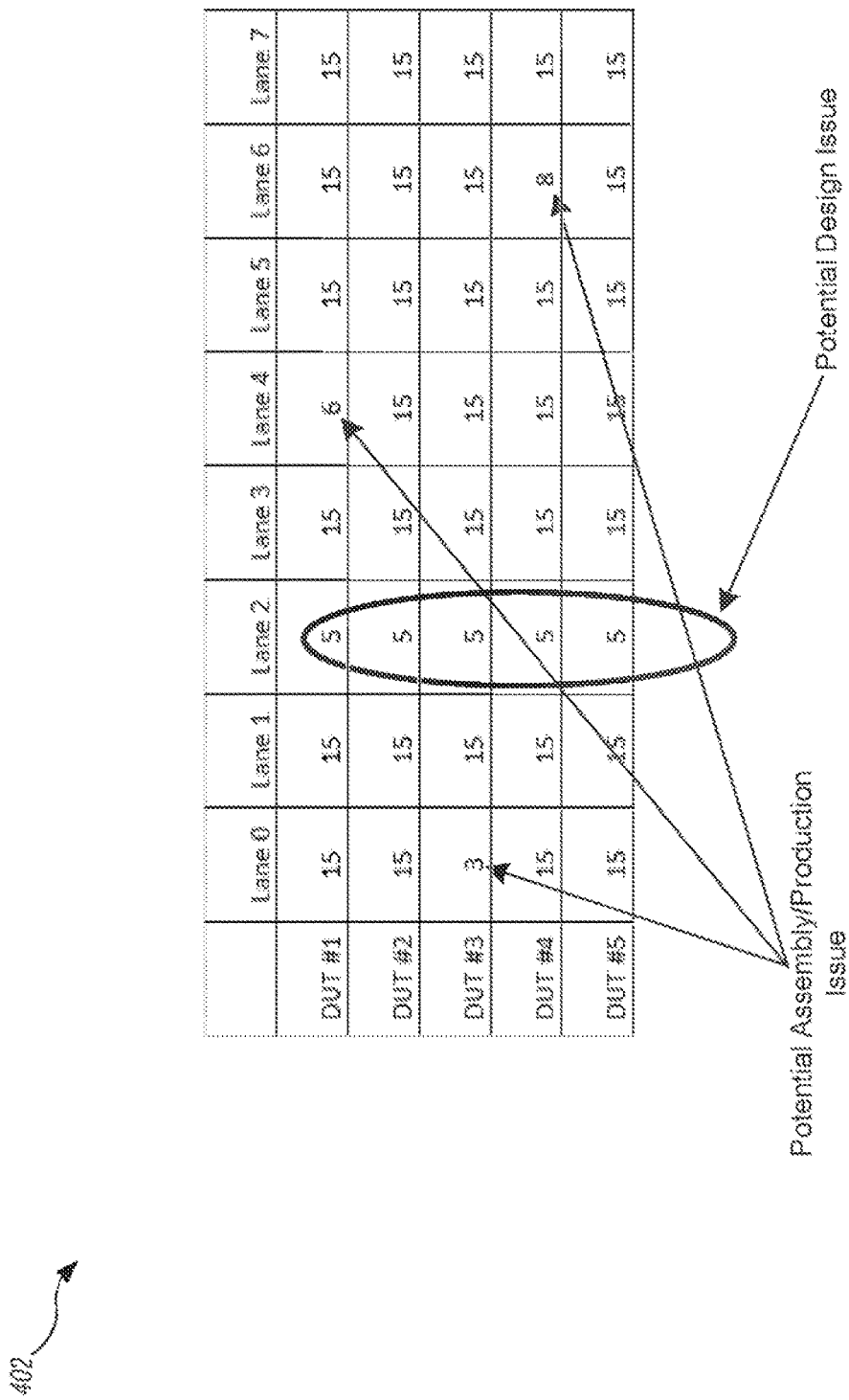
FIG. 4 is a chart showing results of an example margin test of a device under test (DUT) performed by a high-speed I/O margin tester and identification of potential DUT assembly or production issues based on the results of the margin test, according to an example embodiment.

FIG. 4 is a chart 402 showing results of an example margin test of several DUTs performed by the high-speed I/O margin tester 102 and identification of potential DUT assembly or production issues based on the results of the margin test, according to an example embodiment.

In an example embodiment, the margin test may include assessing, by the margin tester 102, for each DUT of a plurality of devices under test (DUTs), timing eye width margin, in either or both Tx and Rx directions, for each high-speed input/output (I/O) lane of a multi-lane high speed I/O link of the DUT. The margin tester 102 may then detect timing eye width margin measurements for multiple DUTs of the plurality of DUTs that are each below a predetermined threshold for different lanes across the multiple DUTs. A potential DUT assembly or production issue may then be detected (visually or automatically by the margin tester 102) based on the detection of the timing eye width margin measurements for the multiple DUTs that are each below the predetermined threshold for different lanes across the multiple DUTs.

As an example, in one embodiment, the add-in card margin tester, such as add-in card margin tester 202 shown in FIG. 2, may be used for bench testing/characterization of pre-production samples of a motherboard with one PCIe x8 slot. The following example test process may be performed using the add-in card margin tester 202 with an E-6 timing eye width margin (Left+right) measured for the slot over several millisecond test on each lane simultaneously. The present example includes timing only for simplicity, but other embodiments may include other measurements. Each measurement in the present example is done 3 times. However, this may be user programmable in various embodiments. The measurements shown in the chart 402 are done at the margin tester receivers as well as the at motherboard DUT receivers. The measurements done at the at motherboard DUT receivers and may be performed in two ways. The first way may be using margin tester jitter (Sj) and voltage swing sweeps. The second way may be using on-die margin testing at the motherboard receiver. For example, the on-die margin testing at the motherboard receiver may, under control of the controller 210 of the add-in card margin tester 202, be run through software on a bootable drive connected to motherboard DUT or basic input/output system (BIOS) software on the motherboard DUT, for supported speeds. In the present example, the measurements are done at 16 GT/s, but may vary and may be user configurable.

The above example test procedure may yield the example results shown in chart 402 for the average margin at the test receiver. As shown in the chart 402, the consistently low margin on Lane 2 across all five DUTs, DUT #1 to DUT #5, may be an indicator of a potential design issue. In contrast, the low margin on DUT #1 Lane 4, DUT #3 on Lane 0, and DUT #4 on Lane 6 may be indicators of potential assembly or production issues with those specific lanes on those specific DUTs.

FIG. 5 is a chart showing results of another example margin test of a device under test (DUT) performed by a high-speed I/O margin tester and identification of potential DUT assembly or production issues based on the results of the margin test, according to an example embodiment.

Similar indicators of potential design issues and/or potential assembly issues may also be seen in the example results shown in the chart 502 of FIG. 5 for voltage swing and Sj average margin at the DUT receiver: As shown in the chart 502, the consistently low margin on Lane 1 across all five DUTs, DUT #1 to DUT #5, may be an indicator of a potential design issue. In contrast, the low margin on DUT #1 Lane 0, DUT #1 on Lane 5, and DUT #2 on Lane 7 may be indicators of potential assembly or production issues with those specific lanes on those specific DUTs.

Additional features of embodiments of the disclosed technology may include the following functionality that may be performed under control of the controller 210 (for example, executing instructions according to a configured FPGA and/or read from another non-transitory computer-readable storage medium): choosing one or more different high-speed I/O protocols with which to perform margin testing test based on the multi-lane high speed I/O link of the DUT; testing multiple ports of the DUT with mixed protocols simultaneously; outputting run-to-run variation in margin over any number of margin test runs of the margin tester on the multi-lane high speed I/O link; implementing fixed Tx Equalization (EQ) on the DUT to test how much of margin variation is due to Tx EQ training variation; using fixed continuous time linear equalization (CTLE) in receivers of the margin tester to test impact of receiver equalization on margin of the multi-lane high speed I/O link of the DUT; using decision feedback equalization (DFE) in the receivers of the margin tester to test impact of receiver equalization on margin of the multi-lane high speed I/O link of the DUT; calculating expected margins for the margin tester based on target channels; automatically producing debug information when low margins are detected as a result of the assessment of the electrical margin of the multi-lane high speed I/O link; switching to using variable Inter Symbol Interference (ISI) source to find how much ISI causes lanes of the multi-lane high speed I/O link to fail; testing each lane individually to identify an amount of margin loss to due to cross-talk of the multi-lane high speed I/O link of the DUT; turning off DFE in the receivers of the margin tester to assess margin with and without DFE and an amount of non-linear discontinuities in each channel associated with the multi-lane high speed I/O link; showing expected margins with reference receivers and typical channels which allows lower than expected margin to be flagged even when the lower than expected margin is consistent across all lanes of the multi-lane high speed I/O link of the DUT and of multiple DUTs; selecting from multiple speeds of the multi-lane high speed I/O link on which the assessment of the electrical margin is performed; inferring when errors have happened at the receivers of the DUT based on traffic traveling in an opposite direction on the multi-lane high speed I/O link by the margin tester using protocol specific knowledge to enable the margin tester to perform margin tests on production lines without software on the DUT; automatically capturing time-domain reflectometry readings (TDRs) of low margin channels detected as a result of the assessment of the electrical margin of the multi-lane high speed I/O link; performing an automated connection to an oscilloscope to automatically capture digitized waveforms when low margins are detected as a result of the assessment of the electrical margin of the multi-lane high speed I/O link; and providing a software plug in to configure the one or more of the user-selectable options for the DUT by configuring DUT silicon to implement the one or more of the user-selectable options. Under control of the controller 210, some of all of the above functionality may also be provided as user-selectable options for operating the margin tester 102.

Additional features of embodiments of the disclosed technology may include a trigger functionality that may be performed under control of the controller 210. That is, the margin tester 102 can include a programmable trigger in and/or a programmable trigger out, meaning that a signal received at the controller 210 can result in a test being performed or a signal can be generated at the controller 210 if a particular event occurs during the test. The programmable trigger can be configured by the user-selectable options in some examples. For example, as mentioned above, the controller 210 can automatically capture time-domain reflectometry readings (TDRs) of low margin channels detected as a result of the assessment of the electrical margin of the multi-lane high speed I/O link, and/or cause an automated connection to an oscilloscope to automatically capture digitized waveforms when low margins are detected as a result of the assessment of the electrical margin of the multi-lane high speed I/O link.

That is, the controller 210 can output a trigger when a particular event or measurement is taken by the controller 210, or the controller 210 may operate based on a trigger signal being receiver at the controller 210.

A trigger signal could be generated by the controller 210, for example, when the transmitter or receiver measurement is below a specified eye width and/or a specified eye height. Additionally or alternatively, the controller 210 could generate a trigger signal when a transmitter or receiver two-dimensional eye measurement is below a specified eye shape or mask. The controller 210 could also generate a trigger signal when a receiver margin is less than a certain amount of voltage or any other measurement. A trigger signal can also be generated during any Link Training and Status State Machine (LTSSM) state transition as a PCIe link trains, or when an error is injected on any specific lane in or more specific LTSSM states or in specific PCIe packets.

In some examples, a programmable delay can also be specified using the user-selectable controls between the specified event and the trigger. Additionally or alternatively, an alternative trigger mode can be provided with low speed encoding for the event type and a specific margin tester model could be defined such that triggers using this mode to an oscilloscope that can automatically configure and post-process accordingly, such as using the same clock data recovery, continuous time linear equalization, and decision feedback equalization as the margin product.

Trigger in settings for the controller 210 can be programmed in a number of different modes. For example, a trigger in signal can be received by the controller 210 based on a configuration or setting, including link speed with or without reset/link training. When the configuration setting occurs, the controller 210 can make a margin measurement. Additionally or alternatively, the controller 210 can receive a trigger in signal when a programmable error has been injected and make a margin measurement when the trigger in signal is received at the controller 210.

Figure 6:
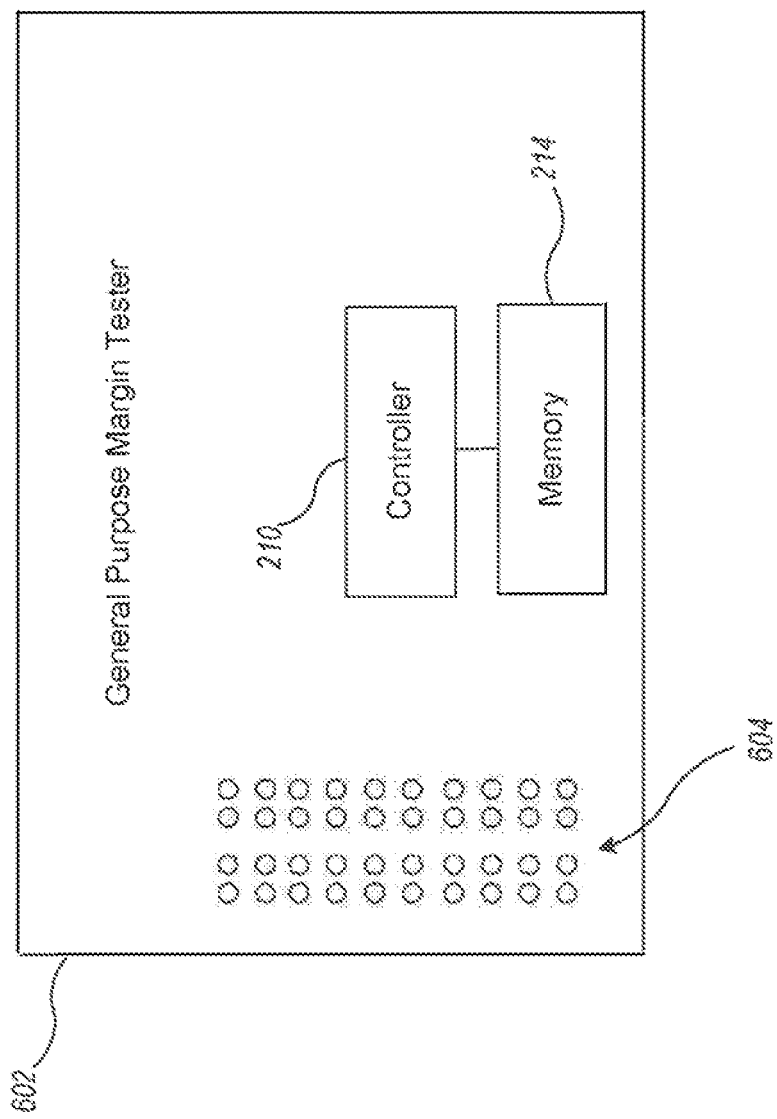
FIG. 6 is a block diagram illustrating a general purpose margin tester with a plurality of interfaces configured to be cabled to at least one test fixture to assess the electrical margin of the multi-lane high speed I/O link of the DUT in both transmit (Tx) and receive (Rx) directions, according to an example embodiment.

FIG. 6 is a block diagram illustrating a general purpose margin tester 602 with a plurality of interfaces 604 configured to be connected, e.g., via one or more cables, to at least one test fixture to assess the electrical margin of the multi-lane high speed I/O link of the DUT in either or both Tx and Rx directions, according to an example embodiment.

The general purpose margin tester 602 includes a controller 210 and associated memory 214, which may store instructions and other data the controller 210 may read, use and/or execute to perform the functions described herein. The general purpose margin tester 602 may include some number of lanes that can be connected, e.g., cabled, to standard test fixtures via interfaces 604, such as the standard PCI Express Compliance Load Board (CLB), to carry out, under control of the controller 210, the same testing as the technology-specific embodiments of the margin tester (e.g., add-in card margin tester 202 and motherboard margin tester 302). In addition, the general purpose margin tester 602 supports multiple protocols and the configuration software of the general purpose margin tester 602 includes options to configure the lanes for different protocols and host/device roles. The general purpose margin tester 602 may also be used to test add-in cards by cabling to test fixtures, including the standard PCI Express Compliance Base Board (CBB) for testing add-in cards. The interfaces 604 of the general purpose margin tester 602 may include standard co-axial connectors and cables for each high speed differential signal or, in various other embodiments, include custom high density connectors and fixtures to minimize the cable count and make switching from one DUT to another DUT more efficient.

In some examples, the DUT may be an interconnect under test, which are traditionally tested with vector network analyzers (VNAs). However, VNAs are often costly and complex. In addition, the scatter parameters (s-parameters) produced by VNA measurements are generally viewed as increasingly unreliable at high frequencies—especially when used in statistical simulation of high-speed serial links.

Examples of the disclosure, however, can use a margin tester 102 to test a passive or active interconnect, including one or more cables and/or PCB segments, to evaluate an actual margin difference across many lanes and parts quickly. These tests can easily identify worst cases and levels of risk of the interconnects. As such, the margin tester 102 can include a "VNA" mode to test active or passive interconnects.

If a single-port margin tester is used, then the transmitters of the single-port are connected to one side of the interconnect under test and the receivers of the single-port are connected to the other side of the interconnect. Then a margin test in non-protocol PRBS can run to test the interconnect under test. Examples of the disclosure however are not limited to a single margin tester 102 to test the interconnect under test. Rather, the test may also be run with the transmitters of one margin tester 102 connected to the interconnect under test and the receivers of another margin tester 102 connected to the other end of the interconnect under test.

Additionally or alternatively, a multi-port margin tester 102 can be used to measure the interconnect under test in an active protocol state after training. In such a set-up, the interconnect under test can be connected to one port of the multi-port margin tester 102 and the other side of the interconnect under test can be connected to another, different port of the multi-port margin tester 102. Then, the interconnect under test can be tested to measure the margin with a protocol in an active protocol state after training. Alternatively, rather than a multi-port tester 102, the multiple margin testers 102 may be used to run the margin test of the interconnect under test.

Figure 7:
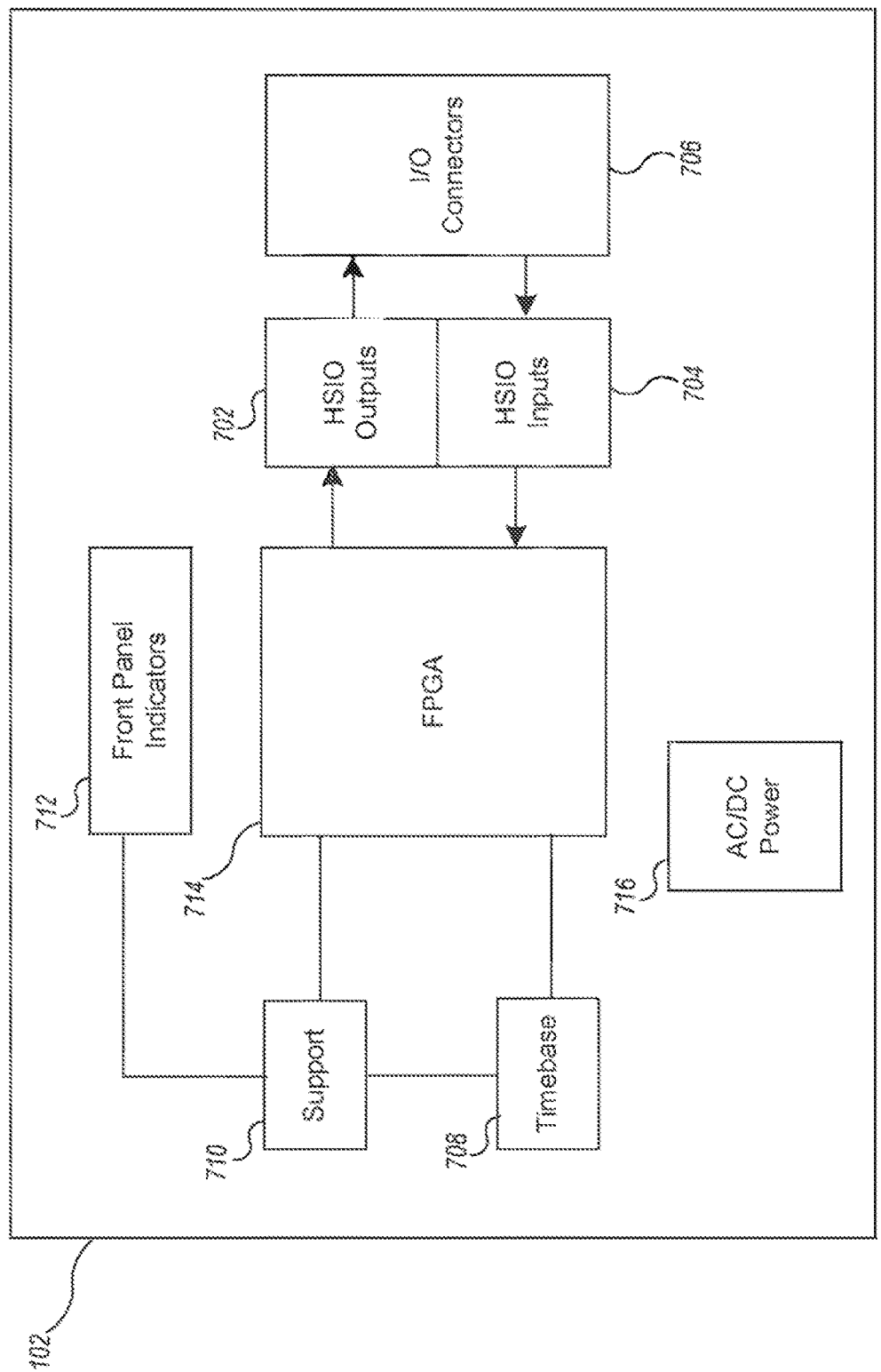
FIG. 7 is a lower level block diagram of a margin tester for testing the electrical margin of a multi-lane high speed I/O link of a DUT in both Tx and Rx directions, according to an example embodiment.

FIG. 7 is a lower level block diagram of a margin tester 102 for testing the electrical margin of a multi-lane high speed I/O link of a DUT in either or both Tx and Rx directions, according to an example embodiment.

Shown is an FPGA 714 operably coupled to a support unit 710 (which may include Ethernet and other communication functionality), a timebase unit 708 for providing a system reference clock, a high-speed I/O (HSIO) outputs unit 702 and a HSIO inputs unit 704. The margin tester 102 may also be powered via an AC/DC power unit 716. The HSIO outputs unit 702 and HSIO inputs unit 704 are also operably coupled to I/O connectors 706. The FPGA 714 is a semiconductor device that is based around a matrix of configurable logic blocks (CLBs) connected via programmable interconnects. In various embodiments, the margin tester 102 may have fewer or more components than shown and some components or functionality of components shown, although in operable communication with the margin tester 102, may be located outside or separate from the margin tester 102, or located or integrated in the FPGA 714.

The FPGA 714 can be reprogrammed to desired application or functionality requirements after manufacturing, such as to perform the functionality of the margin tester 102 described herein. For example, firmware on the FPGA 714 may act as a standard PCI Express upstream port, also referred to as an endpoint, (for testing motherboards, as in the embodiment of the add-in card margin tester 202) or standard PCI Express root port, also referred to as an upstream port or root complex, (for testing add-in cards, such as in the embodiment of the motherboard margin tester 302), including some link layer logic for the margin tester 102 to infer when errors start at the DUT receiver based on traffic in the opposite direction and to quickly reduce margin stress once errors occur to prevent catastrophic link failure. In some embodiments, the FPGA 714 may be implemented using or may otherwise include a systems-on-modules (SoM) architecture that may incorporate memory, interface, etc. in the FPGA 714. The SoM may be implemented, for example, with an Advanced Reduced Instruction Set (RISC) Machine, originally Acorn RISC Machine (ARM) architecture.

A configuration application and/or script may be implemented via the FPGA 714 or stored on another accessible memory device or other non-transitory computer-readable storage media that enables an end user to easily configure margin tester options of the margin tester 102, including multiple runs with one or more of the following options. In some embodiments, an option for a bit error rate (BER) target may be set for margin scans (milliseconds for E-6 type margins and minutes for E-12 type margins). For example, such targets may include, but are not limited to targets related to: number of times to margin, margin timing and/or voltage; fixing Tx equalization for the margin tester or DUT transmitters; and fixing Rx CTLE and DFE for margin tester receivers. In some embodiments, an optional application and/or script is provided that removes data from the margin tester 102 and provides visualization tools for users to view large sets of margin data across multiple products/samples and view averages, run-to-run variations and trends over time and compare margins across multiple runs on the same DUT with different configuration options (fixed Tx equalization, etc.). In some embodiments, an optional application, which may be implemented on a bootable drive to install on the motherboard under test, is provided that unlocks additional options for motherboard testing including, but not limited to: running in loopback instead of LO and using specific patterns; using on the on-die margining features in the DUT silicon instead of the voltage swing and Sj margining from the DUT transmitters, and running both ways and comparing results.

Simulations for PCIe and higher speed links in general increasingly use statistical simulation tools along with transmitter and receiver models to predict eye diagrams for links that are naturally closed without complex reference transmitters and receiver equalization models. One of the most common formats for simulation models is *IBIS*-AMI.

Examples of the disclosure include generating a simulation model, such as, but not limited to, an *IBIS*-AMI model for the margin tester 102 silicon and interconnect. A user can use the margin tester 102 simulation model and connect models for their DUT channel and/or silicon to simulate expected margin results in either direction with a statistical simulation tool.

In some embodiments, an optional plug-in model is provided that would allow the margin tester configuration application to also configure RX equalization settings on the DUT silicon if a plug-in is provided for that particular DUT silicon. In some embodiments, an optional IBIS-AMI (or similar) software model is provided for each individual margin test unit that may be used by designers and system integrators to include in their simulations to help establish test limits/methodology for specific customer setups. IBIS-AMI is a modeling standard for Serializer/Deserializer (SerDes) physical layers (PHYs) that enables fast, accurate, statistically significant simulation of multi-gigabit serial links. In some embodiments, an optional IBIS-AMI model is provided for the margin test unit, along with customer models (IBIS-AMI or scattering (S) parameters) and can also be utilized by follow-on efforts to include some level of system de-embed for increased accuracy and repeatability. A general model for a margin tester 102 can be provided as the model or a specifically tuned model for a particular margin tester 102 with tuning performed as part of manufacturing test and characterization can be generated.

Figure 8:
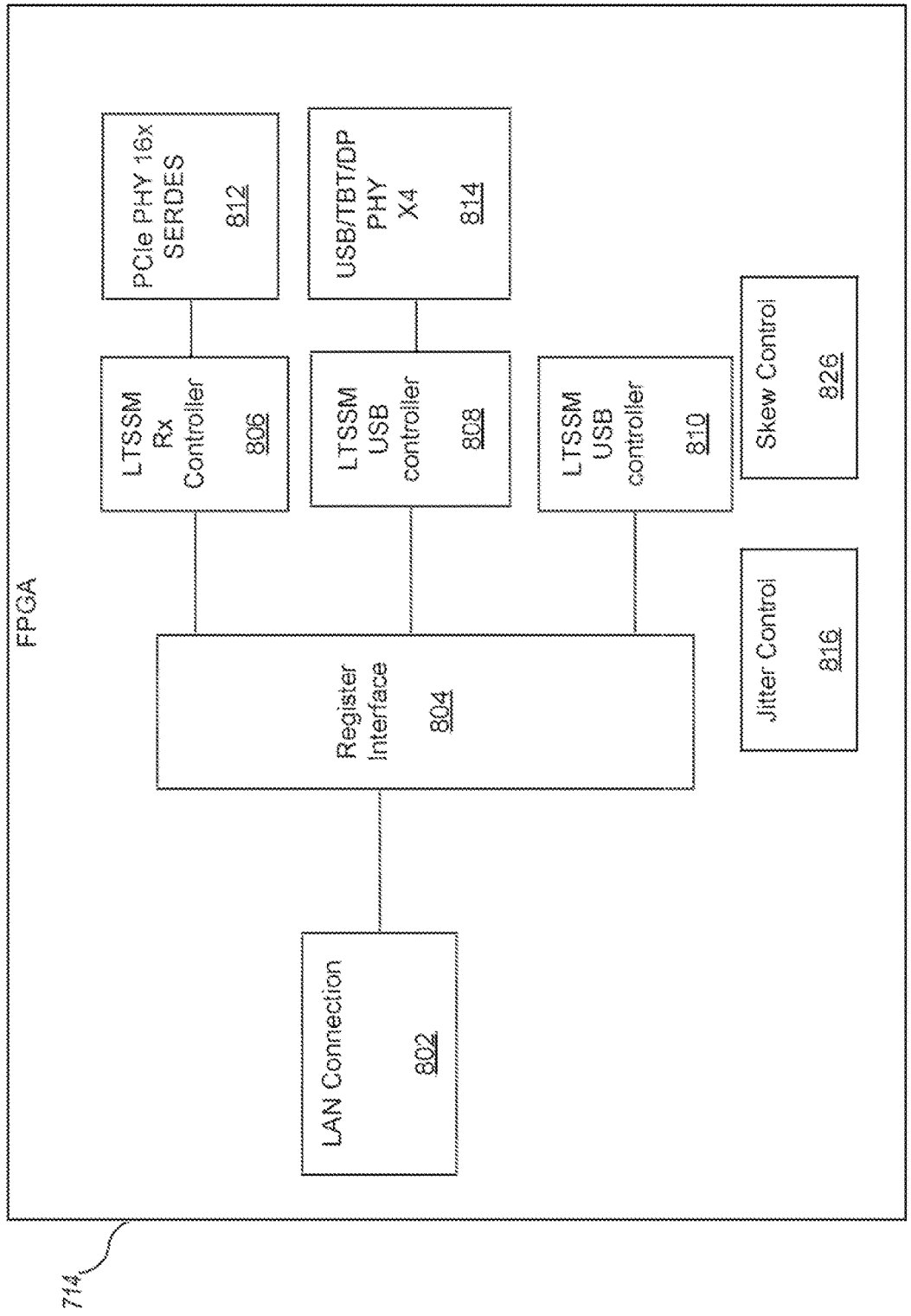
FIG. 8 is a block diagram of an example of a configured field programmable gate array (FPGA) that may be used in a controller of a margin tester for testing the electrical margin of a multi-lane high speed I/O link of a DUT in both Tx and Rx directions, according to an example embodiment.

FIG. 8 is a block diagram of an example of a configured field programmable gate array (FPGA) 714 that may be used in a controller 210 of a margin tester 102 for testing the electrical margin of a multi-lane high speed I/O link of a DUT in either or both Tx and Rx directions, according to an example embodiment.

In various embodiments, the FPGA 714 may have fewer or more components than shown and some components shown, and/or functionality of those components, which are in operable communication with the FPGA 714, may be located outside or separate from the FPGA 714. Shown is a register interface 804 operably coupled to a local area network (LAN) connection 802, which may include a SerDes. The register interface 804 is also operably coupled to a Link Training and Status State Machine (LTSSM), Rx controller 806. One of the processes at the physical layer of the operation of the margin tester 102 is the link initialization and training process. In PCI Express devices, this process establishes many important tasks such as link width negotiation, link data rate negotiation, bit lock per lane, symbol lock/block alignment per lane, etc. All these functions are accomplished by the LTSSM devices, which observe the stimulus from remote link partners as well as the current state of the link, and responds accordingly. The register interface 804 is also operably coupled to one or more additional LTSSM controller units, such as a LTSSM Universal Serial Bus (USB) controller 808 and an additional LTSSM USB controller 810. In the example embodiment shown, the LTSSM Rx controller 806 is operably coupled to a PCIe physical layer (PHY) 16x SerDes 812 and the LTSSM USB controller 808 is operably coupled to a USB/Thunderbolt/Displayport (USB/TBT/DP) PHY x4 unit 814.

When the margin tester 102 is testing a specific protocol, such as PCIe, the margin tester 102 is running the full protocol and can track the link state as the link trains to the active state through the LTSSM controller units 806, 808, and 810. The FPGA 714 of the margin tester 102 can perform margin measurements repetitively as the training proceeds and capture a log of the link training state in time versus the electrical margin in one or both directions.

Figure 16B:
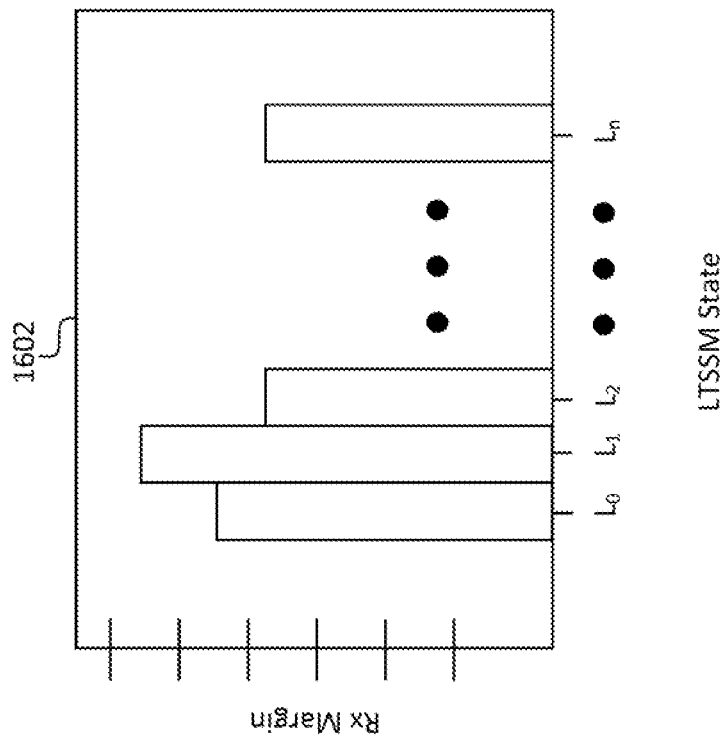
FIGS. 16A and 16B illustrate plots of a link training state versus margin in the transmit direction and receive direction, respectively.
Figure 16A:
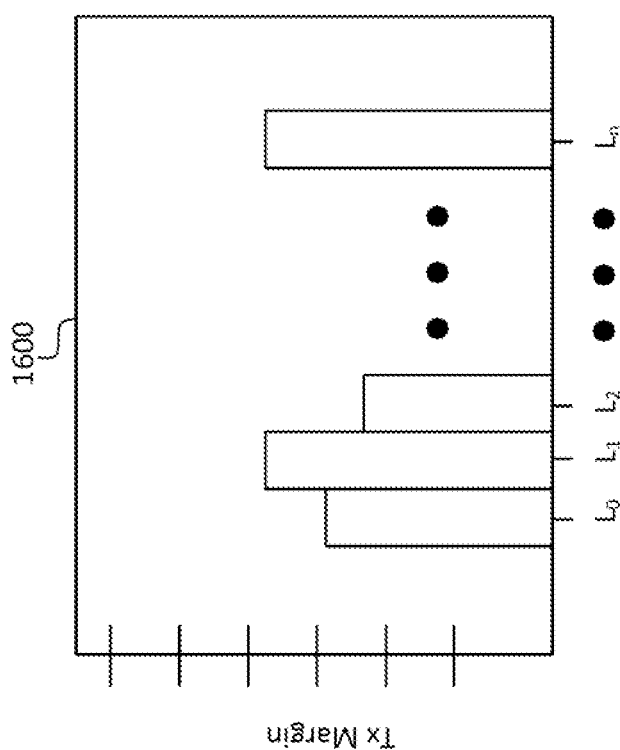

The link training state versus the electrical margin can be displayed to a user by plotting the time and LTSSM state on one axis and the margin per direction, lane, etc. on the other axis. FIGS. 16A and 16B illustrate respective transmit and receive plots 1600 and 1602 that may be displayed to a user. Plot 1600 illustrates the LTSSM state versus the margin for the Tx direction and plot 1602 illustrates the LTSSM state versus the margin for the Rx direction. For example, the x-axis may show the link state, illustrated as Lo through $L_n$, and the y-axis may show the margin, which may be defined in some examples as the eye area.

A user may be able to configure this mode in a number of different ways, however, such as by setting a length of time for the margin measurement, setting the DUT transmission or receiver margin measurements to be used for the mode, which DUT transmission margin measurements of height, width, both, or two-dimensional eyes to use, continuous measurements or measurements on each LTSSM state change, and/or double-sided or single-sided DUT transmission margin measurements of height and/or width. Examples of the disclosure can generate a log of data as the link training progresses with the DUT and plot various values to a user to allow a user to visualize what is happening during a test.

A jitter control unit 816 is also present as part of, or operably coupled to, the FPGA 714 for controlling a jitter insertion unit such that such that the eye margin expected at the DUT receiver can be varied to specific targets for timing or voltage margin without the need for software running on the DUT.

A skew control unit 826 can also be a part of, or operably coupled to, the FPGA 714 for controller a programmable skew. Previously, the only test instruments that could generate varying amounts of skew lane-to-lane across multiple lanes were significantly complex and expensive multi-lane BERTs. The multi-lane BERTs, however, are not capable of running a full training protocol like the margin testers disclosed herein, including transmission equalization training for modern protocols like PCIe. As such, previously there was no way to lab test with a protocol and variety of different skews without extremely expensive and complex test set-ups. Examples of the disclosure, however, can add per lane transmission skew in a number of different ways using the skew control unit 826.

For example, the skew control unit 826 may include individual per lane programmable length first in, first out (FIFO) buffers to set the amount of skew per each lane. Additionally or alternatively, the skew control unit 826 may program per lane variable length transmission FIFOs in the FPGA 714 fabric for each lane. Additionally or alternatively, the skew control unit 826 can include a soft controller that can modify the controller logic to have a variable length programmable per lane transmission FIFOs feeding each of the physical layer transmitters.

Figure 9:
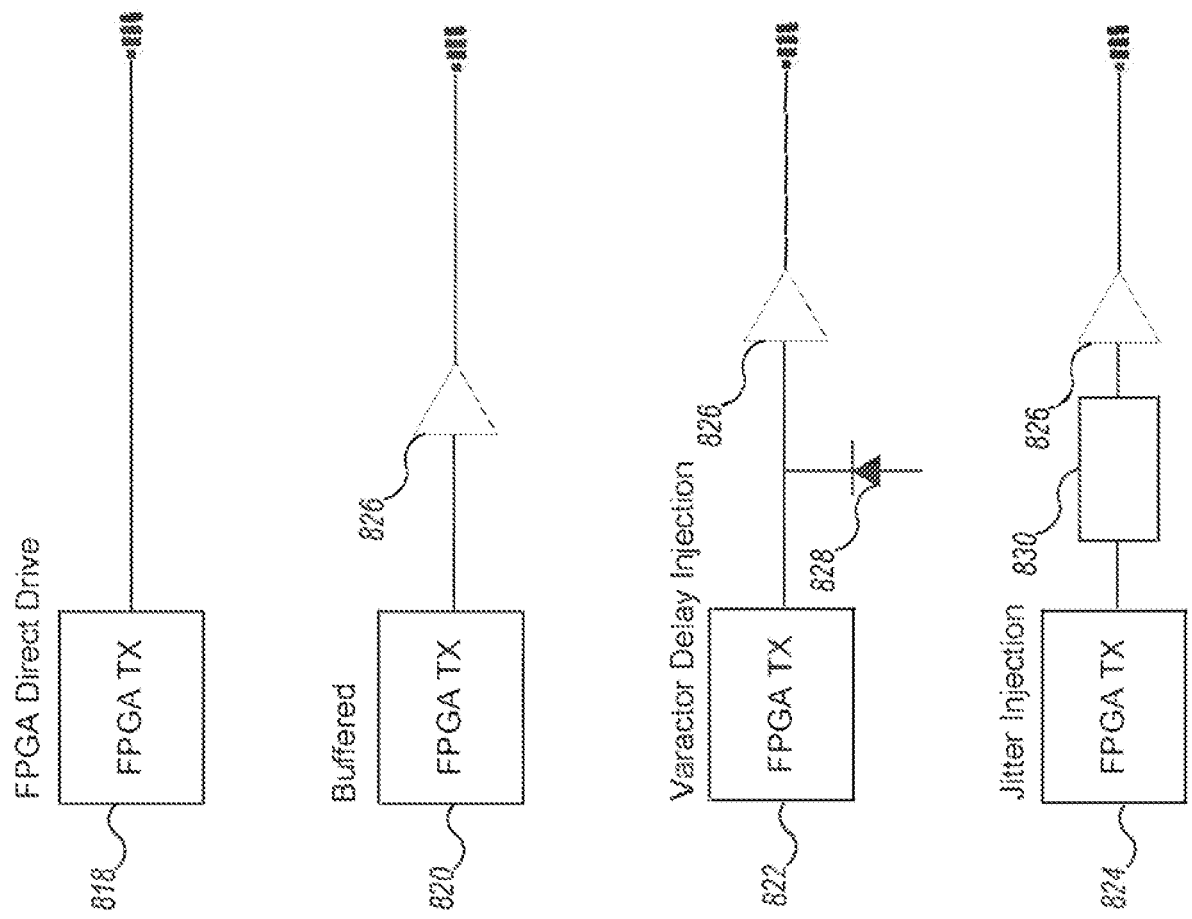
FIG. 9 is a block diagram of example output drive options of an FPGA that may be used in a controller of a margin tester for testing the electrical margin of a multi-lane high speed I/O link of a DUT in the Tx direction, according to an example embodiment.

FIG. 9 is a block diagram of example output drive options of an FPGA, such as FPGA 714, that may be used in a controller, such as controller 210, of a margin tester for testing the electrical margin of a multi-lane high speed I/O link of a DUT in either or both Tx and Rx directions, according to an example embodiment.

The first output drive option is an FPGA direct drive option 818, which is not buffered and does not include any varactor delay injection or jitter injection. The second output drive option is a buffered drive option 820 which includes a linear buffer or limiting amp 826 with differential output voltage (Vod) which does not include any varactor delay injection or jitter injection. The third output drive option is a varactor delay injection option 822, which includes a linear buffer 826 and a varactor component 828, which results in intersymbol interference (ISI) plus some delay, which, for example, may be ~3-5 ps. The fourth output drive option is a jitter injection option 824, which, in one embodiment, may include a linear buffer 826, which may or may not be included, and a delay application specific integrated circuit (ASIC) 830 (~100 ps at 32 GBd), which is also available from ADSANTEC. In some embodiments, the linear buffer 826 is not included. For example, in such embodiments where the linear buffer 826 is not included, the jitter injection may be performed by differential noise injection.

In various embodiments, different kinds of stresses may be used by the margin tester 102 to identify various different corresponding failure modes including, but not limited to, failure modes related to: assembly; interconnects (surface-mount technology (SMT), packages, connectors, through-holes, vias, etc.); defects; impacts series resistance; failure modes that cause ISI and baseline wander; eye closure impact; failure modes that cause other than width closure; functional test escape; operator configuration error; incoming material; process variation; receiver bandwidth, which is similar to interconnect changes; power supply rejection ratio (PSRR); vertical/horizontal eye closure; PLL stability; design; deltas between lanes. The varactor-based method for jitter insertion may be more effective for exacerbating assembly-related defects.

Figure 10:
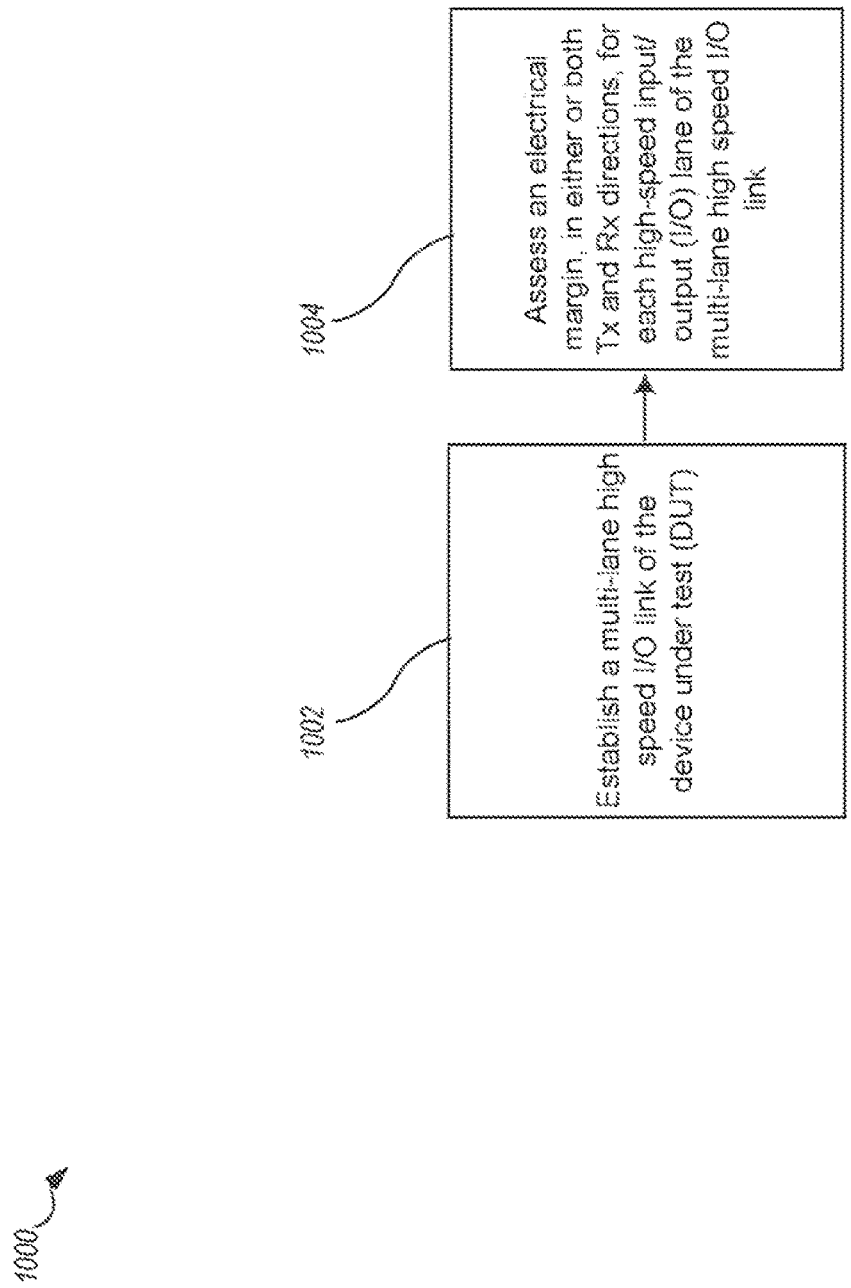
FIG. 10 is a flow diagram of an example method for margin testing a DUT, according to one example embodiment.

FIG. 10 is a flow diagram of an example method 1000 for margin testing a DUT, according to one example embodiment.

At 1002, the margin tester 102 establishes a multi-lane high speed I/O link of the device under test (DUT).

At 1004, the margin tester 102 assesses an electrical margin, in either or both transmit (Tx) and receive (Rx) directions, for each high-speed input/output (I/O) lane of the multi-lane high speed I/O link. For example, the assessing the electrical margin may include injecting adjustable stress on margin test transmitters of the multi-lane high speed I/O link. The adjustable stress may include injection of jitter applied on all lanes of the multi-lane high speed I/O link simultaneously and applying voltage swing. The assessing the electrical margin may also include assessing the electrical margin, in both transmit (Tx) and receive (Rx) directions, simultaneously for each high-speed input/output (I/O) lane of the multi-lane high speed I/O link.

Figure 11:
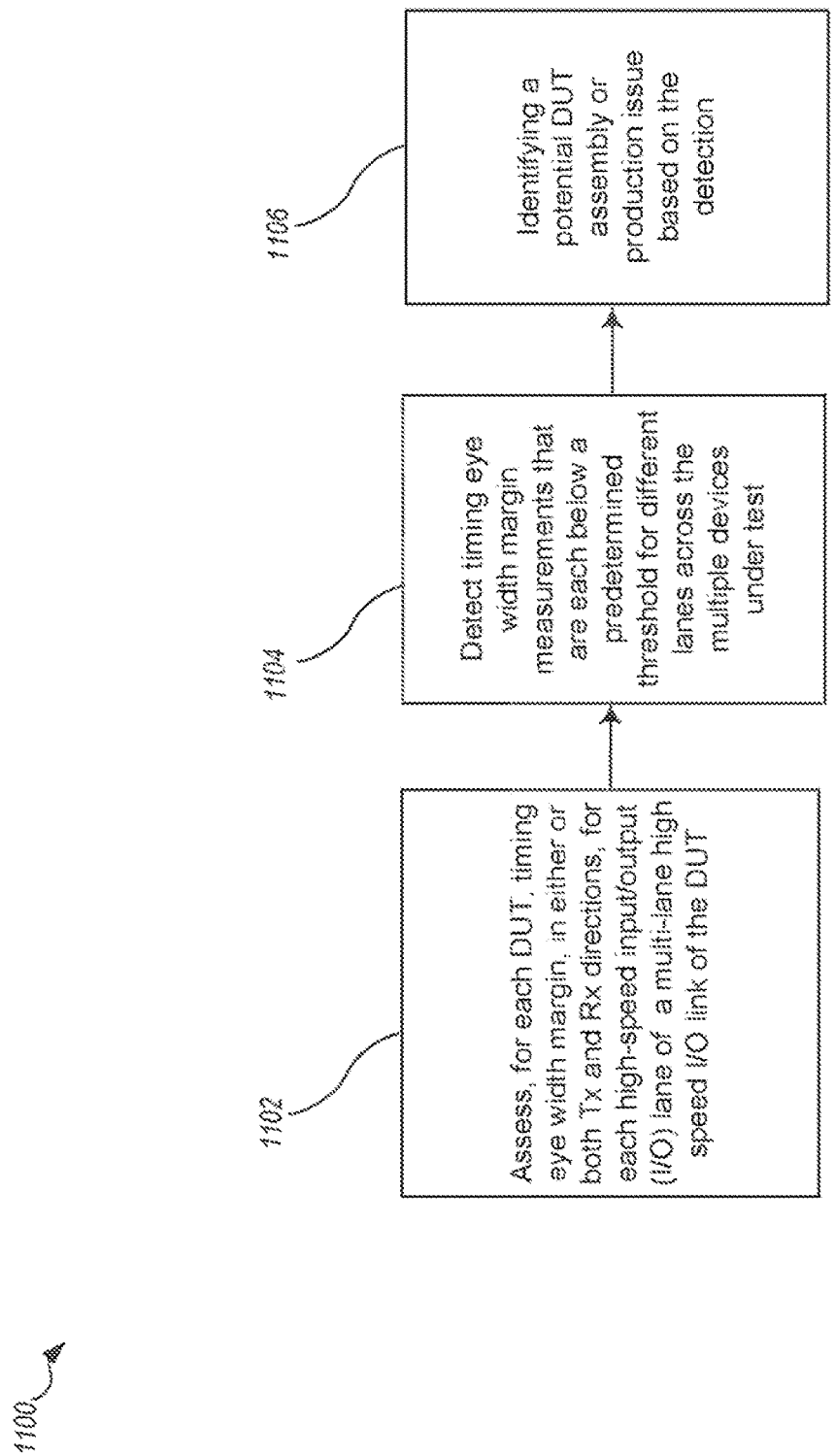
FIG. 11 is a flow diagram of an example method for identifying potential DUT assembly or production issues based on margin testing electrical margin of a multi-lane high speed I/O link of a DUT in both Tx and Rx directions, according to one example embodiment.

FIG. 11 is a flow diagram of an example method 1100 for identifying potential DUT assembly or production issues based on margin testing electrical margin of a multi-lane high speed I/O link of a DUT in either or both Tx and Rx directions, according to one example embodiment.

At 1102, the margin tester 102 assesses, for each DUT of a plurality of DUTs, timing eye width margin, in either or both Tx and receive Rx directions, for each high-speed input/output (I/O) lane of a multi-lane high speed I/O link of the DUT.

At 1104, the margin tester 102 detects, based on the assessing, timing eye width margin measurements for each DUT of the plurality of DUTs that are consistently below a predetermined threshold for a same lane across the plurality of DUTs.

At 1106, the margin tester 102 identifies a potential DUT design issue based on the detection of the timing eye width margin measurements for each DUT of the plurality of DUTs that are consistently below the predetermined threshold for the same lane across the plurality of DUTs. The detecting may also or instead include, detecting, based on the assessing, timing eye width margin measurements for multiple DUTs of the plurality of DUTs that are each below a predetermined threshold for different lanes across the multiple DUTs.

Figure 12:
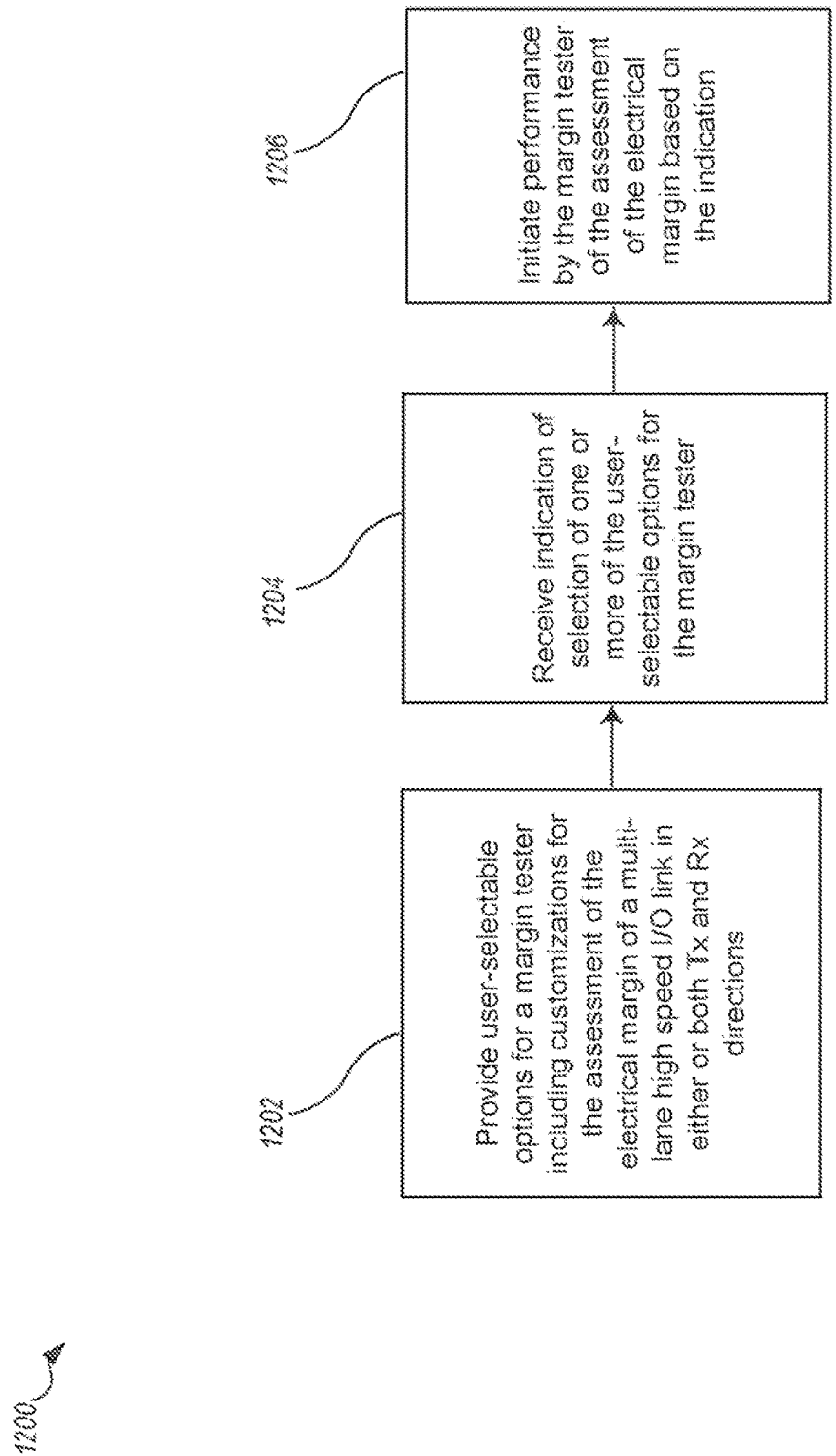
FIG. 12 is a flow diagram of an example method for initiating performance by the margin tester of the assessment of the electrical margin based on user-selectable options, according to one example embodiment.

FIG. 12 is a flow diagram of an example method 1200 for initiating performance by the margin tester 102 of the assessment of the electrical margin based on user-selectable options, according to one example embodiment.

At 1202, the margin tester 102 provides user-selectable options for a margin tester that is configured to establish a multi-lane high speed input/output (I/O) link of a device under test (DUT) and to assess an electrical margin of the multi-lane high speed I/O link in either or both transmit (Tx) and receive (Rx) directions. The user-selectable options may include customizations for the assessment of the electrical margin of the multi-lane high speed I/O link.

At 1204, the margin tester 102 receives an indication of selection of one or more of the user-selectable options for the margin tester 102.

At 1206, the margin tester 102 initiates performance by the margin tester 102 of the assessment of the electrical margin of the multi-lane high speed I/O link based on the indication of the selection of the one or more of the user-selectable options for the margin tester 102. The user-selectable options may include, but are not limited to, one or more of: a selectable option to choose one or more different high-speed I/O protocols with which to perform margin testing test based on the multi-lane high speed I/O link of the DUT; a selectable option to test multiple ports of the DUT with mixed protocols simultaneously; a selectable option to output run-to-run variation in margin over any number of margin test runs of the margin tester on the multi-lane high speed I/O link; a selectable option to implement fixed Tx Equalization (EQ) on the DUT to test how much of margin variation is due to Tx EQ training variation; a selectable option to use Fixed CTLE in receivers of the margin tester to test impact of receiver equalization on margin of the multi-lane high speed I/O link of the DUT; a selectable option to use Decision Feedback Equalization (DFE) in the receivers of the margin tester to test impact of receiver equalization on margin of the multi-lane high speed I/O link of the DUT; a selectable option to calculate expected margins for the margin tester based on target channels; a selectable option to automatically produce debug information when low margins are detected as a result of the assessment of the electrical margin of the multi-lane high speed I/O link; a selectable option for the margin tester to switch to using variable Inter Symbol Interference (ISI) source to find how much ISI causes lanes of the multi-lane high speed I/O link to fail; a selectable option for the margin tester to test each lane individually to identify an amount of margin loss to due to cross-talk of the multi-lane high speed I/O link of the DUT; a selectable option to turn off DFE in the receivers of the margin tester to assess margin with and without DFE and an amount of non-linear discontinuities in each channel associated with the multi-lane high speed I/O link; a selectable option for characterization data for the margin tester that shows expected margins with reference receivers and typical channels and allows lower than expected margin to be flagged even when the lower than expected margin is consistent across all lanes of the multi-lane high speed I/O link of the DUT and of multiple DUTs; a selectable option to select from multiple speeds of the multi-lane high speed I/O link on which the assessment of the electrical margin is performed; a selectable option for the margin tester to infer when errors have happened at the receivers of the DUT based on traffic traveling in an opposite direction on the multi-lane high speed I/O link by the margin tester using protocol specific knowledge to enable the margin tester to perform margin tests on production lines without software on the DUT; a selectable option to automatically capture Time-Domain Reflectometry readings (TDRs) of low margin channels detected as a result of the assessment of the electrical margin of the multi-lane high speed I/O link; a selectable option to perform an automated connection to an oscilloscope to automatically capture digitized waveforms when low margins are detected as a result of the assessment of the electrical margin of the multi-lane high speed I/O link; and a selectable option to configure the one or more of the user-selectable options for the DUT by configuring DUT silicon to implement the one or more of the user-selectable options.

Figure 13:
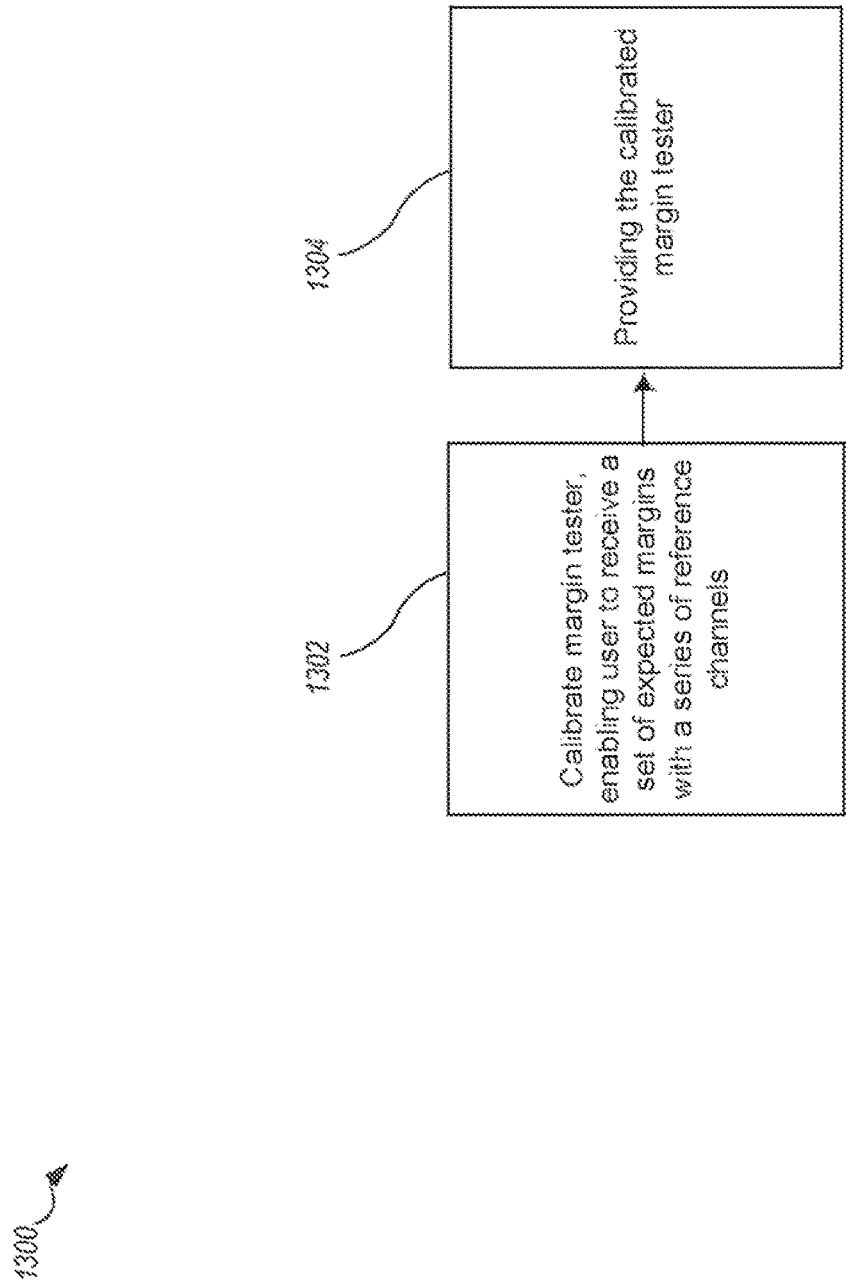
FIG. 13 is a flow diagram of an example method for providing a calibrated margin tester, according to one example embodiment.

FIG. 13 is a flow diagram of an example method 1300 for providing a calibrated margin tester, according to one example embodiment.

At 1302, the margin tester 102 may provide options to perform or may perform calibration of the margin tester 102, enabling a user to receive a set of expected margins with a series of reference channels.

At 1304, the calibrated margin tester is provided that is configured to measure electrical eye margin in either or both transmit (Tx) and receive (Rx) directions of a device under test (DUT) with a fully running operation link of the DUT without special test modes and to capture full loading and cross-talk effects. An individually calibrated model for the margin tester may also be provided, enabling computation of expected margins with one or more of: individualized system channels, receiver models and transmitter models. Also, a feature in DUT silicon is provided that enables the margin tester to use vendor defined messages or another protocol mechanism to indicate that a margin test is about to take place by the margin tester, causing the DUT silicon to be able to disable logic that would degrade link width or speed of the link due to errors for a duration of the margin test.

A software application of the margin tester is also provided, that enables performance of testing by the margin tester of a channel component under test (e.g., bare printed circuit board (PCB) or a cable) in a testing configuration where a margin tester is used on either or both sides of the channel component under test. In some embodiments, hardware of the margin tester is provided to a company that manufactures a printed circuit board (PCB) and data associated with use of the margin tester is provided to silicon companies which provide silicon used in production of the PCB.

Figure 14:
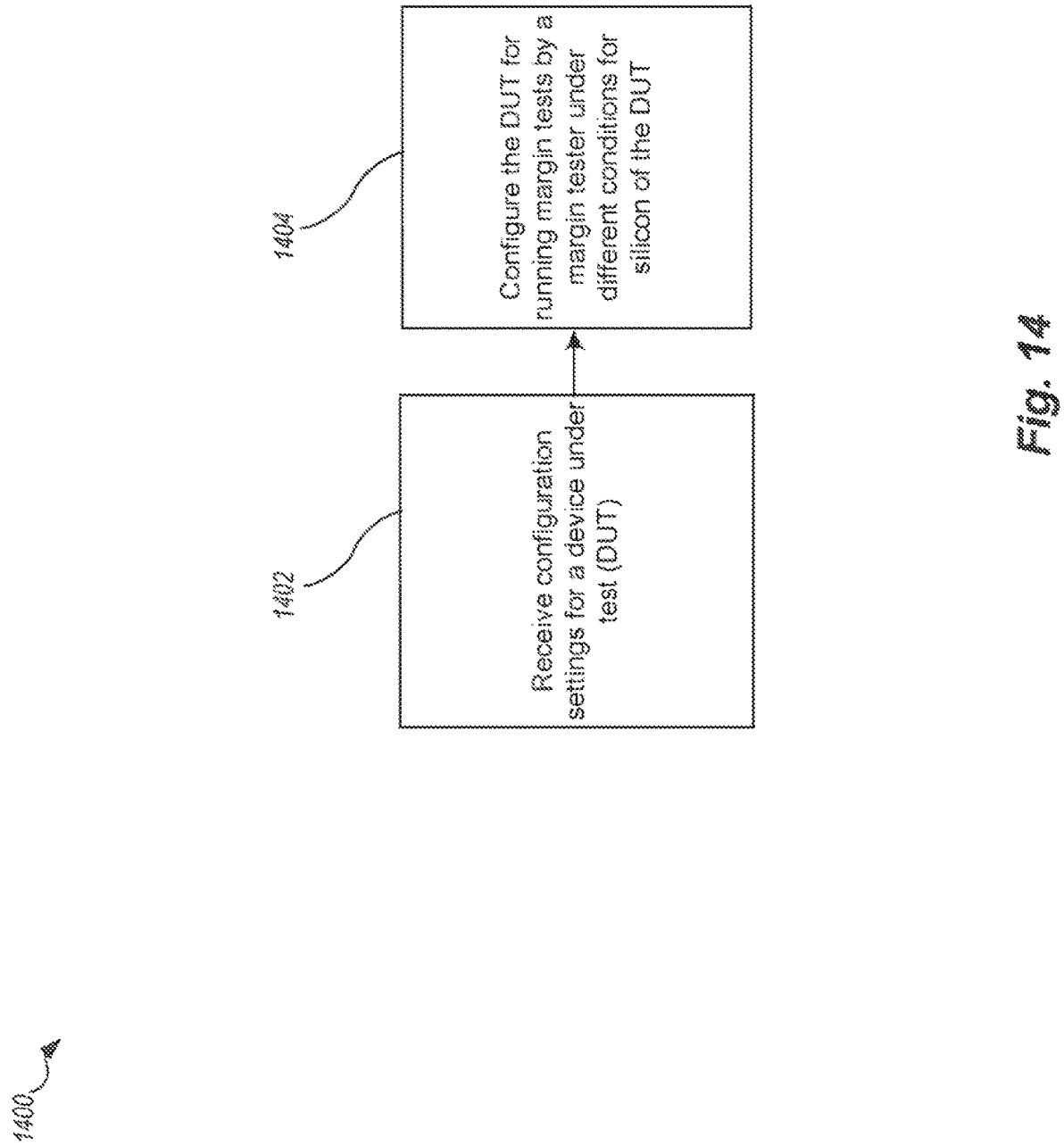
FIG. 14 is a flow diagram of an example method for configuring the DUT for running margin tests, according to one example embodiment.

FIG. 14 is a flow diagram of an example method 1400 for configuring the DUT for running margin tests, according to one example embodiment.

At 1402 the margin tester 102 receives configuration settings for a device under test (DUT).

At 1404, the margin tester 102 configures the DUT for running margin tests by the margin tester 102 under different conditions for silicon of the DUT. The margin tester 102 may receive a software plug-in that enables configuration and DUT silicon parameters for running the margin tests by the margin tester 102 under the different conditions for the silicon of the DUT. The DUT silicon parameters may include, but are not limited to, one or more of: parameters related to receiver continuous time CTLE and parameters related to DFE.

Figure 15:
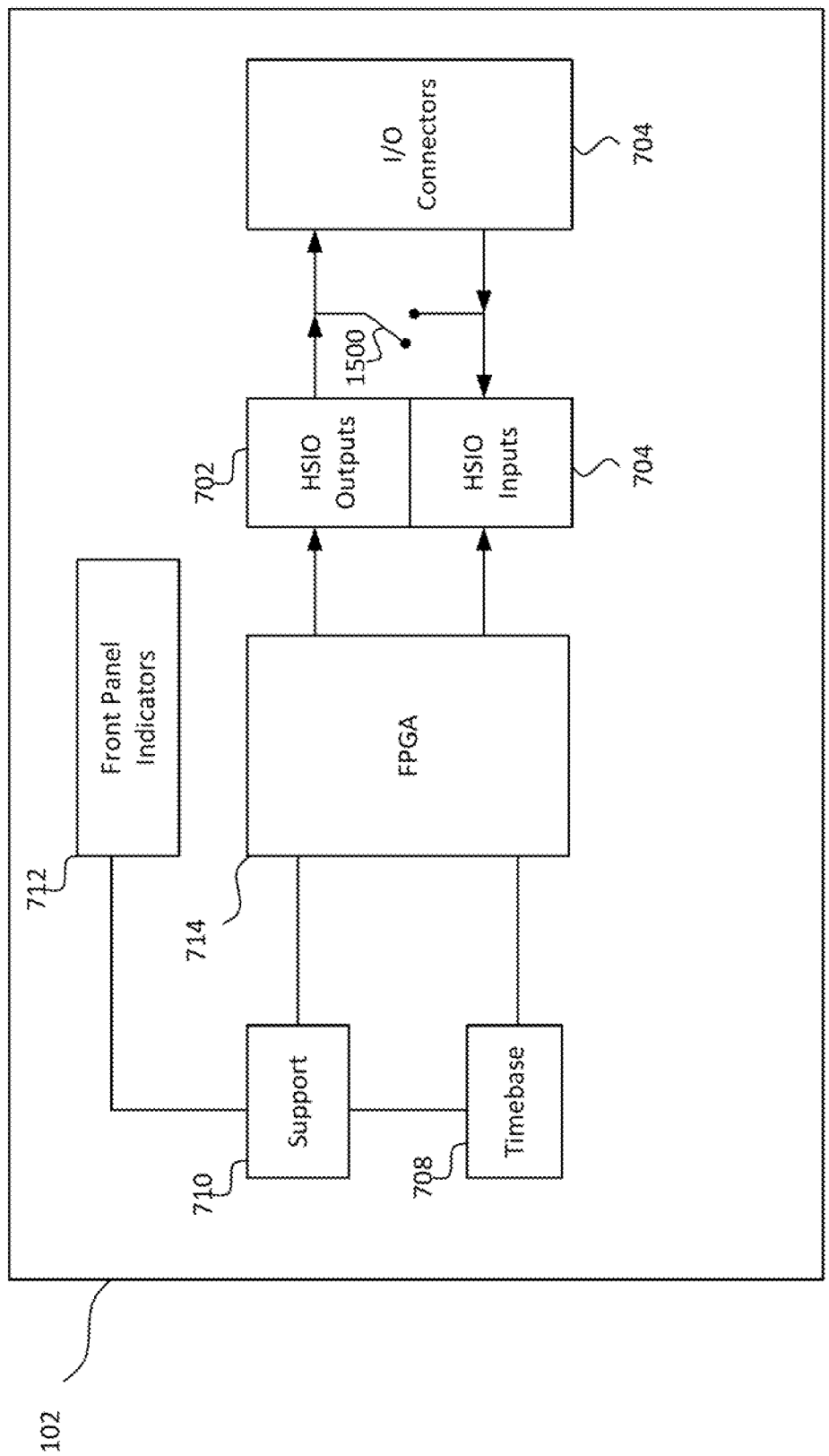
FIG. 15 is another lower level block diagram of a margin tester for testing the electrical margin of a multi-lane high speed I/O link of a DUT in both Tx and Rx directions, according to an example embodiment.

FIG. 15 illustrates an example of a margin tester 102 with self-calibration. Calibration of the margin tester 102 can be performed by electrically connecting the transmitters to the receivers. This can be done, for example, by a switch within the margin tester 102 to electrically connect the transmitters to the receivers in the same margin tester 102. This eliminates a need for external test equipment.

FIG. 15 is similar to the lower level block diagram of FIG. 7. Similar to FIG. 7, FIG. 15 is a lower level block diagram of a margin tester 102 for testing the electrical margin of a multi-lane high speed I/O link of a DUT in either or both Tx and Rx directions, as well has having self-calibration. To perform the self-calibration, one or more switches 1500 can be provided to connect each of the transmitters in the HSIO outputs unit 702 to each of the receivers in the HSIO inputs unit 704. The transmitters can output a signal and the receivers can receive the signal and determine if the margin tester 102 is within a desired range. A single switch 1500 is shown in FIG. 15 for ease of illustration, but as will be understood by one skilled in the art, multiple switches 1500 may be provided to connect the transmitters to the receivers. Alternatively to the switch 1500, a calibration device or fixture may be provided at the I/O connectors 706 to cause the transmitters to loop back to the receivers to perform self-calibration Different operating modes may be provided for performing calibration of the margin tester 102. For example, self-calibration may be performed only at the factory with a special loopback fixture that can connect the transmitters to the receivers through one or more of the I/O connectors 706.

Another operating mode that may be provided is having an end-user perform a self-test of the margin tester 102. This can be done by activating the switch 1500 or inserting a fixture that can route the transmitters to the receivers of the margin tester 102. During the self-test, the margin tester 102 may output to the front panel indicators 712 if the results are outside a specified range.

In some examples, the calibration can be performed in either a protocol mode, a PRBS pattern non-protocol mode, or both. However, in a protocol mode, the I/O connectors 706 may not be able to act as both a host and a test device simultaneously. If the margin tester 102 has two sets of I/O connectors 706, then the margin tester 102 may have to connect the two different sets of I/O connectors 706 or a second margin tester 102 may have to be connected.

The internal calibration can provide faster and potentially less expensive factory calibration for the margin testers 102 than traditional instruments. The internal calibration can also can enable an end user to perform their own calibration testing.

Benefits, advantages and improvements of the disclosed embodiments include, but are not limited to the following features. Some embodiments can be implemented almost entirely with off-the shelf components including standard FPGAs and sinusoidal jitter injection chips or delay lines and have very low cost compared to traditional BERTs and scopes. An example embodiment can run on full multi-lane links operating in the normal operating state without the need for special software and capturing any effects due to the all lanes operating at once. Another advantage is that embodiments of the present disclosure can test in either or both directions (Tx and Rx) in a single self-contained unit. Various embodiments can also be run in a production environment (for example, in a motherboard production test environment) without the need for any software or modifications on the DUT. Test specific logic, which varies by protocol, may be provided in the margin tester 102 silicon/firmware to recognize very quickly when errors are occurring at the DUT receiver based on the data that is being transmitted back to the margin tester by the device under test. Some example embodiments include features implemented in the DUT silicon to recognize through PCI Express vendor specific messages or other standard protocol features that margin testing is going to take place and place the DUT silicon in a state where it would not degrade the link width and/or speed normally due to errors. This helps to ensure that the margining process to the DUT receivers using noise injection or voltage swing adjustments could occur without risk of degrading the link width or speed through normal protocol mechanisms. This is an alternative to special logic to quickly infer when errors start and reduce stress before link or speed degradation can occur.

Another improvement provided by an example embodiment described herein is that each margin tester unit of a plurality of margin testers units are individually calibrated and characterized so the users know expected margin values with each specific unit and can flag even the smallest discrepancies from expectation across their pre-production and production units. As part of this individual characterization and calibration a model such as an IBIS-AMI model may be provided for each individual margin tester 102 that enables end users to compute expected margins for their specific channel models based on simulated or measured S parameters.

The disclosure describes ingenious margin testers that are very fast and very simple to use. Convenient and efficient configuration software is provided for the length margin measurements and various options that are configurable by the user. Once configured, the margin tester 102 brings up the link as any standard device and then automatically performs the measurements on the operating link. The testing takes place on all lanes simultaneously and for quick electrical margin scans can take place in milliseconds. This enables volume testing, including full testing of all high speed I/O ports and lanes. Various embodiments provide different margin test modes to enable some level of problem characterization without the need for traditional instruments including, but not limited to: a repeat count and analysis of run-to-run variability in margin and selected Tx equalization (for both DUT and margin tester) and selected RX equalization (for margin test receivers) and likelihood of training issues in the DUT under test Tx or Rx training algorithms; fixing Transmitter Equalization in either direction and observing the impact on margins; fixing receiver equalization (CTLE) and number of DFE taps (including zero) in the margin tester receiver and looking at the impact on margin values. For example, significant margin changes if DFE may be turned off indicate a significant discontinuity in a specific channel.

Another advantage provided by various embodiments of the margin tester 102 is that every high speed I/O port and lane of a particular DUT can be tested for electrical margin across all pre-production units and in actual production and create an unprecedented ability to flag issues and potential issues before they ever make it to production or before they make it to customers. Various embodiments also enable margin to be analyzed before and after a variety of link events like power state transitions (in some cases, using software on the DUT).

Prior solutions have very general purpose and highly-featured jitter and noise insertion methods. Various embodiments of the disclosure have an advantage over those solutions by significantly simplifying, but not eliminating, jitter/amplitude stress to accomplish this needed task. This simplicity translates into lower operating cost, faster results, and increased product confidence (through large data set collection) over what would be required using existing methods.

Aspects of the disclosure may operate on a particularly created hardware, on firmware, digital signal processors, or on a specially programmed general purpose computer including a processor operating according to programmed instructions. The terms controller or processor as used herein are intended to include one or more microprocessors, microcomputers, Application Specific Integrated Circuits (ASICs), and dedicated hardware controllers working independently or in conjunction with each other. One or more aspects of the disclosure may be embodied in computer-usable data and computer-executable instructions, such as in one or more program modules, executed by one or more computers (including monitoring modules and controllers), or other devices. Generally, program modules include routines, programs, objects, components, data structures, etc. that perform particular tasks or implement particular abstract data types when executed by a processor in a computer or other device. The computer executable instructions may be stored on a non-transitory computer readable storage medium such as a hard disk, optical disk, removable storage media, solid state memory, DDR memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A test system, comprising:
a margin tester including a plurality of interfaces for electrical connection to external devices, wherein at least one interface of the margin tester is configured to connect to a removable test fixture, the test fixture being external to the margin tester and configured to connect to a device under test (DUT);
the margin tester having:
one or more lanes connected to the at least one interface; and
a controller coupled to the at least one interface through the one or more lanes, wherein the controller is configured to establish a single-lane or multi-lane high speed input/output (I/O) link with the DUT via the test fixture, in which, for one or more lanes of the single-lane or multi-lane high speed I/O link, the controller implements physical and logical link layers that communicatively connect the margin tester with the DUT via the at least one interface and the test fixture, and to cause the margin tester to assess an electrical margin of the single-lane or multi-lane high speed I/O link in either or both transmit (Tx) and receive (Rx) directions.

2. The test system of claim 1, wherein the at least one interface comprises at least one lane configured to be connected to the DUT via the test fixture to assess the electrical margin of the single-lane or multi-lane high speed I/O link with the DUT in either or both the Tx and Rx directions.

3. The test system of claim 2, wherein the at least one lane comprises a plurality of lanes, and wherein the controller is configured to support multiple different protocols for the margin tester to test multiple different devices under test that each operate according to a different protocol.

4. The test system of claim 3, wherein the controller is further configured to provide options to configure the plurality of lanes for different device roles and the multiple different protocols.

5. The test system of claim 1, wherein the single-lane or multi-lane high speed I/O link with the DUT is a fully running operational link without a special test mode.

6. The test system of claim 1, wherein:
the test fixture includes a printed circuit board (PCB) of an add-in card and the DUT is a motherboard, and
the add-in card is configured to be plugged into a connector on the motherboard to implement the physical and logical link layers for each lane of the single-lane or multi-lane high speed I/O link.

7. The test system of claim 1, wherein the controller is configured to assess the electrical margin of the single-lane or multi-lane high speed I/O link by at least being configured to inject adjustable stress on margin test transmitters.

8. The test system of claim 1, wherein the controller is configured to assess the electrical margin of the single-lane or multi-lane high speed I/O link by at least being configured to vary an amount of skew per lane.

9. The test system of claim 1, wherein the controller is further configured to output a trigger signal when an event is detected during the electrical margin assessment.

10. The test system of claim 1, wherein the controller is further configured to cause the margin tester to assess the electrical margin when a trigger signal is received.

11. The test system of claim 1, wherein the controller is further configured to capture a log of link training state versus an electrical margin during the electrical margin assessment.

12. The test system of claim 1, wherein each of the one or more lanes includes a transmitter and receiver and the controller is further configured to perform a calibration by coupling each transmitter with a respective receiver.

13. The test system of claim 1, wherein the DUT is an interconnect under test and the controller is further configured to activate a vector network analyzer mode of the margin tester to test the interconnect under test.

14. The test system of claim 13, wherein the interconnect under test is coupled between at least one transmitter and at least one receiver of the one or more lanes.

15. A method for electrical margin testing a device under test (DUT), the method comprising:
coupling the DUT to a plurality of lanes of a margin tester, wherein the margin tester includes a controller and a plurality of interfaces for electrical connection to external devices, and wherein at least one interface of the margin tester is configured to connect to a removable test fixture, the test fixture being external to the margin tester and configured to couple the plurality of lanes of the margin tester to the DUT;
establishing a multi-lane high speed input/output (I/O) link with the DUT through the plurality of lanes, wherein for one or more lanes of the multi-lane high speed I/O link, said establishing includes implementing physical and logical link layers that communicatively connect the margin tester with the DUT via the at least one interface and the test fixture; and assessing, by the margin tester via the test fixture, an electrical margin, in either or both transmit (Tx) and receive (Rx) directions, for each high-speed input/output (I/O) lane of the multi-lane high speed I/O link.

16. The method of claim 15, further comprising varying an amount of skew per lane when assessing the electrical margin.

17. The method of claim 15, further comprising generating a trigger signal when an event is detected during the electrical margin assessment.

18. The method of claim 15, further comprising receiving a trigger signal and assessing the electrical margin when the trigger signal is received.

19. The method of claim 15, further comprising capturing a log of link training state versus an electrical margin during the electrical margin assessment.

20. The method of claim 15, wherein each lane includes a transmitter and receiver and the method further includes calibrating the margin tester by coupling a transmitter with a receiver and performing a calibration.

21. The method of claim 15, wherein the DUT is an interconnect under test and the method further includes activating a vector network analyzer mode of the margin tester to test the interconnect under test.

22. The method of claim 21, wherein the interconnect under test is coupled between at least one transmitter and at least one receiver of the plurality of lanes.

23. A margin tester comprising:
a plurality of interfaces, wherein at least one interface of the plurality of interfaces is configured to connect to a removable test fixture that is connectable to a device under test (DUT);
one or more lanes connected to the at least one interface to couple the margin tester, via the test fixture, to the DUT; and
one or more controllers configured to:
establish a single-lane or multi-lane high speed input/output (I/O) link with the DUT through the one or more lanes and the test fixture, in which, for one or more lanes of the single-lane or multi-lane high speed I/O link, the one or more controllers implement physical and logical link layers that communicatively connect the margin tester with the DUT via the at least one interface and the test fixture; and
assess an electrical margin of the single-lane or multi-lane high speed I/O link in either or both transmit (Tx) and receive (Rx) directions.

24. The margin tester of claim 23, wherein the one or more controllers are further configured to establish the single-lane or multi-lane high speed I/O link with the DUT with the margin tester acting as a root complex.

25. The margin tester of claim 23, wherein the one or more controllers are further configured to establish the single-lane or multi-lane high speed I/O link with the DUT with the margin tester acting as an endpoint.

* * * * *